United States Patent
Ehsan et al.

(10) Patent No.: US 11,802,335 B1
(45) Date of Patent: Oct. 31, 2023

(54) NIPD NANO-ALLOY FILM AS A ELECTROCATALYST AND METHODS OF PREPARATION THEREOF

(71) Applicant: KING FAHD UNIVERSITY OF PETROLEUM AND MINERALS, Dhahran (SA)

(72) Inventors: Muhammad Ali Ehsan, Dhahran (SA); Abbas Saeed Hakeem, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

Patent file contains an affidavit/declaration under 37 CFR 1.130(b).

(21) Appl. No.: 17/842,119

(22) Filed: Jun. 16, 2022

(51) Int. Cl.
  *C23C 16/16*  (2006.01)
  *C23C 16/448*  (2006.01)
  *C23C 16/04*  (2006.01)
  *C25B 1/04*  (2021.01)

(52) U.S. Cl.
  CPC .......... *C23C 16/16* (2013.01); *C23C 16/4486* (2013.01); *C23C 16/045* (2013.01); *C25B 1/04* (2013.01)

(58) Field of Classification Search
  None
  See application file for complete search history.

(56) References Cited

U.S. PATENT DOCUMENTS

| 10,501,321 B2 | 12/2019 | Kuttiyiel et al. |
| 2020/0370189 A1 | 11/2020 | Ehsan et al. |

FOREIGN PATENT DOCUMENTS

| CN | 109012693 A | * 12/2018 | ............. B01J 23/89 |
| CN | 113394410 A | 9/2021 | |
| CN | 113774422 A | 12/2021 | |
| EP | 2611948 A2 | 7/2013 | |

OTHER PUBLICATIONS

Babar et al "NiPd nano-alloy film as a promising low overpotential electrocatalyst for high activity water oxidation reaction". Journal of Environmental Chemical Engineering 10 (May 24, 2022) 107959 with its supporting information (Year: 2022).*

(Continued)

*Primary Examiner* — Jose I Hernandez-Kenney
(74) *Attorney, Agent, or Firm* — Oblon, McClelland, Maier & Neustadt, L.L.P.

(57) ABSTRACT

An aerosol-assisted chemical vapor-deposition (AACVD) method of making NiPd nano-alloy electrocatalyst. The method includes subjecting a mixture including Pd(II)acetylacetonate $Pd(C_5H_7O_2)_2$, Ni(II)acetylacetonate $Ni(C_5H_7O_2)_2$ and a solvent to AACVD, to form a NiPd nano-alloy electrocatalyst. The NiPd nano-alloy electrocatalyst is formed on a surface of a porous metallic substrate in a single-step. The electrocatalyst of the present disclosure exhibits excellent OER activity, demonstrates excellent durability during prolonged water electrolysis experiments and imposing kinetics for OER.

18 Claims, 29 Drawing Sheets

(56) References Cited

OTHER PUBLICATIONS

Ehsan et al. "Direct deposition of a nanoporous palladium electrocatalyst for efficient hydrogen evolution reaction". New Journal of Chemistry, Apr. 13, 2020, 44, 7795 (hereafter "Ehsan2020") (Year: 2020).*

Ehsan et al. "Fabrication of thickness-controlled NiPd nanoalloy thin films as anticorrosive coatings on 316L SS substrates for application in marine environment". Surface & Coatings Technology 418 (May 1, 2021) 127253 (Year: 2021).*

Subject. (2016). In Editors of the American Heritage Dictionaries (Ed.), The American Heritage (R) dictionary of the English language (6th ed.). Houghton Mifflin. Credo Reference: https://search.credoreference.com/content/entry/hmdictenglang/subject/0?institutionId=743 (Year: 2016).*

Zhang et al. "Low-temperature active, oscillation-free PdNi(alloy)/Ni-foam catalyst with enhanced heat transfer for coalbed methane deoxygenation via catalytic combustion" Applied Catalysis B: Environmental 187 (2016) 238-248 (Year: 2016).*

Joya et al. "Nanoscale palladium as a new benchmark electrocatalyst for water oxidation at low overpotential" Journal of Material Chemistry A, 2019, 7, 9137 (Year: 2019).*

Thiyagarajan, et al. ; Self-supported amorphous TaNx(Oy)/nickel foam thin film as an advanced electrocatalyst for hydrogen evolution reaction ; Royal Society of Chemistry ; Feb. 14, 2022 ; 4 Pages.

Sagu, et al. ; Electrocatalytic activity of $CoFe_2O_4$ thin films prepared by AACVD towards the oxygen evolution reaction in alkaline media ; Electrochemistry Communications 87 ; pp. 1-4 ; Dec. 15, 2017 ; 4 Pages.

Wen, et al. ; Novel-Phase Structural High-Efficiency Anode Catalyst for Methanol Fuel Cells: $\alpha$-$(NiCu)_3Pd$ Nanoalloy ; The Journal of Physical Chemistry C ; 2014 ; 8 Pages.

Babar, et al. ; Spray-Coated Thin-Film Ni-Oxide Nanoflakes ass Single Electrocatalysts for Oxygen Evolution and Hydrogen Generation from Water Splitting ; ACS Omega 5(9) ; May 7, 2020 ; 30 Pages.

* cited by examiner

NIPD NANO-ALLOY FILM AS A ELECTROCATALYST AND METHODS OF PREPARATION THEREOF

BACKGROUND

Technical Field

The present disclosure is directed to electrocatalysts, particularly to a NiPd nano-alloy film as an electrocatalyst for high activity water oxidation reaction and methods of making the NiPd nano-alloy film.

DESCRIPTION OF RELATED ART

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

The use of hydrogen as a renewable fuel offers distinct advantages when compared to fossil fuels such as high energy density, $CO_2$ neutrality, environmentally benignity, natural abundance source (obtainable from water), and a reducing agent in numerous catalytic reactions. However, natural pure hydrogen is almost unavailable on the earth's surface. Conventional methods for large-scale hydrogen production such as fossil fuel reforming and gasification cause excessive $CO_2$ emissions. Alternatively, hydrogen extracted from the electrochemical water splitting process is a clean and economically feasible energy source that is green, renewable, and inexpensive.

Electrochemical water splitting is accomplished in two reaction steps designated as hydrogen evolution reaction (HER) and oxygen evolution reaction (OER). The OER is considered more challenging than HER because it consumes four electrons to release $O_2$ and thus requires more energy for its completion. Highly efficient and durable electrocatalysts are necessary to complete these reactions at faster rates. Conventional noble metal catalysts (Ir/Ru oxides) are used to expedite the OER. However, their high price and scarcity are the major hurdles to deployment. Therefore, a need exists to develop cost-efficient and earth-rich catalysts with high stability and great OER activity to implement water splitting at the industrial level.

SUMMARY

In an exemplary embodiment, an aerosol-assisted chemical vapor-deposition (AACVD) method is described. The method includes subjecting a mixture comprising Pd(II) acetylacetonate $Pd(C_5H_7O_2)_2$, Ni(II)acetylacetonate $Ni(C_5H_7O_2)_2$ and a solvent to aerosol-assisted chemical vapor deposition, to form a NiPd nano-alloy electrocatalyst. The NiPd nano-alloy electrocatalyst is formed on a surface of a porous metallic substrate in a single-step.

In some embodiments, the porous metallic substrate is a Fe foam, Ni foam, or Cu foam.

In some embodiments, the NiPd nano-alloy electrocatalyst is formed by aerosol-assisted chemical vapor-deposited the mixture for an interval of from 60 to 180 minutes.

In some embodiments, the aerosol-assisted chemical vapor-depositing forms an electrocatalyst having an onset potential of at least 1.4 volts (V), a current density of at least 10 milliampere per square centimeter ($mA/cm^2$); an overpotential of from 180-370 millivolts (mV); and a peak current density of at least 1300 $mA/cm^2$.

In some embodiments, the NiPd nano-alloy electrocatalyst has surface exposed catalytic sites which provide an electrochemical active surface area to measure catalytic activity.

In some embodiments, the porous metallic substrate has a length of at least 1 centimeter (cm) and a width of at least 2 cm.

In some embodiments, the NiPd nano-alloy electrocatalyst has a uniform layer of nanoparticles after at least 60 minutes of deposition. The electrocatalyst has a heap of spherical beads after at least 120 minutes of deposition, and the heap of spherical beads coalesces to form a compact thin film layer after at least 180 minutes of deposition.

In some embodiments, the thin film layer formed after 180 minutes of deposition exhibits a crystalline structure on the surface of the porous metallic substrate.

In some embodiments, the NiPd nano-alloy electrocatalyst has an average particle size in a longest dimension of from 20 to 50 nanometers (nm).

In some embodiments, the NiPd nano-alloy electrocatalyst has a plurality of fringes on the surface of the electrocatalyst. The inter-planar distance between neighboring fringes of the plurality of fringes is at least 0.2 nm.

In some embodiments, the NiPd nano-alloy electrocatalyst has a Tafel slope of from 58 millivolt per decade (mV/dec) to 75 mV/dec.

In some embodiments, the NiPd nano-alloy electrocatalyst has an exchange current density of from 0.5 $mA/cm^2$ to 1.25 $mA/cm^2$ In some embodiments, a mass of the NiPd nano-alloy electrocatalyst formed on the porous metallic substrate is from 0.1 to 0.5 mg per area of the NiPd nano-alloy electrocatalyst.

In some embodiments, the NiPd nano-alloy electrocatalyst has a turnover frequency of from 1.3 per second ($s^{-1}$) to 4.5 $s^{-1}$.

In some embodiments, the NiPd nano-alloy electrocatalyst has a specific activity of from 1.4 $mA/cm^2$ to 4 $mA/cm^2$.

In another exemplary embodiment the surface of the NiPd nano-alloy electrocatalyst has an electrochemically active surface area (ECSA) of at least 480 $cm^2$.

In some embodiments, the NiPd nano-alloy electrocatalyst has a small charge transfer resistance of from 5 ohms ($\Omega$) to 13$\Omega$.

In some embodiments, the NiPd nano-alloy electrocatalyst has a double layer capacitance of from 8.5 mF to 10.5 millifarad (mF).

In some embodiments, the NiPd nano-alloy electrocatalyst has a mass activity, at a roughness factor of at least 350 mV, of from 650 milliampere per milligram (mA/mg) to 3600 mA/mg.

The foregoing general description of the illustrative present disclosure and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
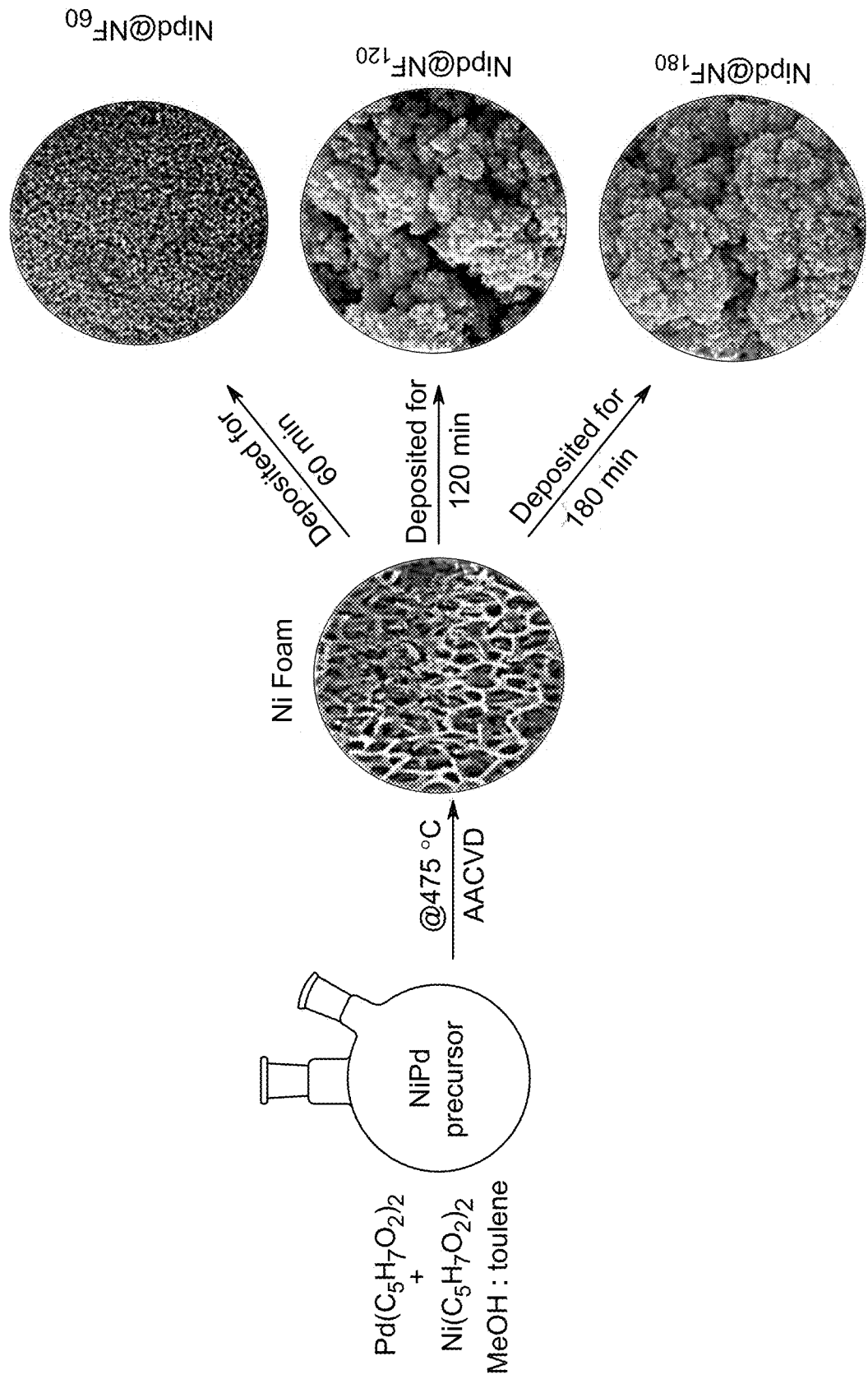
FIG. 1 is a schematic illustration for the AACVD assisted preparation of NiPd alloy over nickel foam (NF) by varying deposition time from 60 to 180 minutes, according to an embodiment of present disclosure.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values there between.

Electrocatalytic materials including binary metal alloys/oxides, metal nitrides, transition metal chalcogenides, metallic phosphides, and metal-free carbon materials with high water splitting efficiencies have been reported. Among transition metals, nickel (Ni) based nanomaterials have been extensively investigated in energy production and storage devices. Nickel compounds owing to their good electrical characteristics, low price, widespread availability, and accessibility make them appealing for a variety of applications. However, nickel-based benchmark electrocatalysts have not been disclosed yet due to poor conductivity and instability leading to a sluggish OER process. The present disclosure describes a method of making Ni-containing electrocatalysts that overcome the shortcomings by making electrocatalysts containing alloys and composites of Ni with other noble and non-noble metals. Non-limiting examples of noble metals include ruthenium, rhodium, palladium, silver, osmium, iridium, platinum, and gold. Non-limiting examples of non-noble metals include aluminum, antimony, copper, iron, lead, niobium, tin, titanium, and zinc.

Aspects of the present disclosure are directed towards developing competent, sustainable, and high-performing low overpotential electrocatalytic materials to expedite the sluggish kinetics of OER for large-scale water electrolysis. For this purpose, a NiPd nano-alloy electrocatalyst is described herein for an energy-efficient water oxidation reaction. NiPd nano-alloy were deposited on a nickel foam (NF) substrate in a single-step, and facile aerosol assisted chemical vapor deposition (AACVD) method by varying the deposition time from 60 to 180 minutes, preferably 70 to 170 minutes, preferably 80 to 160 minutes, preferably 90 to 150 minutes, preferably 90 to 150 minutes, preferably 100 to 140 minutes, preferably 110 to 130 minutes, or 120 minutes.

The nickel foam substrate can be described as a low density, permeable structure of cells and continuous ligaments offering a high surface area to volume ratio, and also a high strength to weight ratio. The permeability can be attributed to empty, vacuous, or vacant matter within the structure. The AACVD method functions by atomising a solution of Ni and Pd chemical precursors into liquid droplets (the aerosol) instead of relying, as in conventional CVD, on evaporation of precursors by passing a carrier gas through a heated bubbler. In a preferred embodiment, Pd(II) acetylacetonate Pd(C$_5$H$_7$O$_2$)$_2$, Ni(II)acetylacetonate Ni(C$_5$H$_7$O$_2$)$_2$, and a solvent are atomized into liquid droplets and deposited on the nickel foam substrate. The deposition occurring in a single step refers to the atomizing a single precursor solution into an aerosol then depositing directly on the substrate to form the catalyst without need for further purification, reaction, or activation.

In a non-limiting example, the solvent is toluene. One or more additional solvents may be used such as methanol, N-Methyl-2-pyrrolidone (NMP), toluene, benzene, acetone, chloroform, and ether. One or more additional chemical precursors can be used such as palladium acetylacetonate, iron acetylacetonate, platinum acetylacetonate, tantalum acetylacetonate, and copper acetylacetonate. One or more additional metal foams or derivatives can be used such as cooper foam, iron foam, magnesium foam, zinc foam, gold foam, tantalum foam, lead foam, brass foam, silver foam, silver-copper foam, metallic glasses, shape-memory alloys, and martensitic alloys.

The fabricated NiPd@NF electrodes were extensively characterized by various analytical techniques and were directly employed for OER investigation in 1.0 M KOH. One or more additional bases can be used for the OER investigation such as LiOH, NaOH, RbOH, CsOH, Ca(OH)$_2$, Sr(OH)$_2$, and Ba(OH)$_2$. The results indicate that the NiPd@NF$_{120}$ exhibits excellent OER activity and initiates OER at an extremely low onset potential of 1.4 V vs. RHE($\eta$=170 mV), requires an overpotential of just 180 mV, preferably 178 mV, preferably 176 mV, preferably 172 mV, or 170 mV to approach the benchmark current density of 10 mA cm$^{-2}$ and peak current density of >1300 mA cm$^{-2}$ is achieved at an overpotential of mere 370 mV. Moreover, the catalyst demonstrates excellent durability during prolonged water electrolysis experiments and imposing kinetics for OER. The catalytic performance of NiPd electrodes is many fold better than a noble metal catalyst (i.e., IrO$_2$) investigated under similar conditions.

The NiPd@NF catalyst presents impressive kinetics for OER process and operates very well at two different current density values 10 and 20 mA cm$^{-2}$, preferably 12 and 18 mA cm$^{-2}$, preferably 14 and 16 mA cm$^{-2}$, or 15 mA cm$^{-2}$ for longer periods of 24 h, preferably 26 h, preferably 28 h, preferably 30 h, preferably 32 h, preferably 34 h, or 36 h without significant loss in potential, thus demonstrating long-term stability in the OER process. Furthermore, post catalysis material investigations signpost no obvious changes in catalyst attributes and proved sustainability of catalyst in OER reactions. The superior OER activity of NiPd nano-alloy at such low overpotentials is accredited to mutual relevance of high electroactive sites, the favorable synergy created between intrinsically active 3d-transition metal (Ni) and noble (Pd) metal grown over porous and conductive NF surface that cumulatively favors electronic communications and adsorption/desorption process. The AACVD provides a facile route for fabricating highly effective thin film electrocatalyst in a short time.

In an exemplary embodiment, a AACVD method for preparing the NiPd nano-alloy electrocatalyst is described. The method includes subjecting a mixture containing Pd(II) acetylacetonate Pd(C$_5$H$_7$O$_2$)$_2$, Ni(II)acetylacetonate Ni(C$_5$H$_7$O$_2$)$_2$, and a solvent to aerosol-assisted chemical vapor deposition on a surface of a porous metallic substrate in a single-step to form the NiPd nano-alloy electrocatalyst. The porous metallic substrate is Fe foam, Ni foam, or a Cu foam. In a preferred embodiment, the porous metallic substrate is Ni foam. In an embodiment, the NiPd nano-alloy electrocatalyst is formed by aerosol-assisted chemical vapor-depositing the mixture for an interval of from 60 to 180 minutes, preferably 70 to 170 minutes, preferably 80 to 160 minutes, preferably 90 to 150 minutes, preferably 90 to 150 minutes, preferably 100 to 140 minutes, preferably 110 to 130 minutes, or 120 minutes. The formation of a NiPd@NF catalytic thin film on the substrate surface using AACVD is highly beneficial in forming an electrocatalyst capable of reducing the overpotential and increasing the OER performance. Also, this method evades the need for binders and conducting agents, which makes the synthesis process simple, fast, and cost-reductive.

Meanwhile, the optimum loading of electrocatalyst material can be easily anchored on the substrate surface and is considered have better properties including high conductivity, enhanced mechanical stability, and rapid charge transfer. The nanostructured surface of surface-anchored thin film provides abundant exposed catalytic sites and regulates the binding energies of participating metals to optimize the adsorption and desorption energy of intermediates for the dynamic evolution of reaction products on the electrocatalyst surface. Exposed catalytic sites can be described as an area or region disposed on the electrocatalyst surface that offers a location for adsorption and transformation of reactants/intermediates or for measuring electrochemical properties of the electrocatalyst itself.

In some embodiments, the aerosol-assisted chemical vapor-depositing forms an electrocatalyst having an onset potential of at least 1.4 V, preferably at least 1.38 V, preferably at least 1.36 V, preferably at least 1.34 V, preferably at least 1.32 V, preferably at least 1.3 V, preferably at least 1.28 V, preferably at least 1.26 V, preferably at least 1.24 V, preferably at least 1.22 V, or 1.2 V; a current density of at least 10 mA/cm$^2$, preferably 9 mA cm$^{-2}$, preferably 8 mA cm$^{-2}$, preferably 7 mA cm$^{-2}$, preferably 6 mA cm$^{-2}$, or 5 mA cm$^{-2}$; an overpotential of from 180-370 mV, preferably 200-350 mV, preferably 220-330 mV, preferably 240-310 mV, preferably 260-290 mV, or 275 mV; a peak current density of at least 1300 mA/cm$^2$, preferably at least 1290 mA cm$^{-2}$, preferably at least 1280 mA cm$^{-2}$, preferably at least 1270 mA cm$^{-2}$, preferably at least 1260 mA cm$^{-2}$, or at least 1250 mA cm$^{-2}$.

In a non-limiting example, the porous substrate may have a length of at least 1 cm, preferably at least 1.05 cm, preferably 1.1 cm, preferably 1.15 cm, preferably 1.2 cm, preferably 1.25 cm, preferably 1.3 cm, preferably 1.35 cm, preferably 1.4 cm, preferably 1.45 cm, or 1.5 cm and a width of at least 2 cm, preferably at least 2.05 cm, preferably 2.1 cm, preferably 2.15 cm, preferably 2.2 cm, preferably 2.25 cm, preferably 2.3 cm, preferably 2.35 cm, preferably 2.4 cm, preferably 2.45 cm, or 2.5 cm. In a non-limiting example, the particles of the electrocatalyst may have an average size in a longest dimension that ranges from 20 nm to 50 nm, preferably 22.5 nm to 47.5 nm, preferably 25 nm to 45 nm, preferably 27.5 nm to 42.5 nm, preferably 30 nm to 40 nm, preferably 32.5 nm to 37.5 nm, or 350 nm. In a non-limiting example, the inter-planar distance between neighboring fringes of the plurality of fringes is at least 0.2 nm, preferably at least 0.221 nm, at least 0.22 nm, at least 0.23 nm, at least 0.24 nm, at least 0.25 nm, at least 0.26 nm, at least 0.27 nm, at least 0.28 nm, at least 0.29 nm, or 0.3 nm.

In a non-limiting example, the electrocatalyst has a Tafel slope of from 58 mV/dec to 75 mV/dec, preferably 59 mV/dec to 74 mV/dec, preferably 60 mV/dec to 73 mV/dec, preferably 61 mV/dec to 72 mV/dec, preferably 62 mV/dec to 70 mV/dec, preferably 63 mV/dec to 69 mV/dec, preferably 64 mV/dec to 68 mV/dec, preferably 65 mV/dec to 67 mV/dec, or 65 mV/dec. In a non-limiting example, the electrocatalyst has an exchange current density of from 0.5 mA/cm$^2$ to 1.25 mA/cm$^2$, preferably 0.6 mA/cm$^2$ to 1.1 mA/cm$^2$, preferably 0.7 mA/cm$^2$ to 1 mA/cm$^2$, preferably 0.8 mA/cm$^2$ to 0.9 mA/cm$^2$, or 0.85 mA/cm$^2$. In a non-limiting example, a mass of the electrocatalyst formed on the porous metallic substrate is from 0.1 to 0.5 mg. preferably 0.15 to 0.45 mg, preferably 0.2 to 0.4 mg, preferably 0.25 to 0.35 mg, or 0.3 mg.

In a non-limiting example, the electrocatalyst has a turnover frequency of from 1.3 s$^{-1}$ to 4.5 s$^{-1}$, preferably 1.5 s$^{-1}$ to 4.3 s$^{-1}$, preferably 1.7 s$^{-1}$ to 4.1 s$^{-1}$, preferably 1.9 s$^{-1}$ to 3.9 s$^{-1}$, preferably 2.1 s$^{-1}$ to 3.7 s$^{-1}$, preferably 2.3 s$^{-1}$ to 3.5 s$^{-1}$, preferably 2.5 s$^{-1}$ to 3.3 s$^{-1}$, preferably 2.7 s$^{-1}$ to 3.1 s$^{-1}$, or 2.9 s$^{-1}$. In a non-limiting example, the electrocatalyst has a specific activity of from 1.4 mA/cm$^2$ to 4 mA/cm$^2$, preferably 1.6 mA/cm$^2$ to 3.8 mA/cm$^2$, preferably 1.8 mA/cm$^2$ to 3.6 mA/cm$^2$, preferably 2 mA/cm$^2$ to 3.4 mA/cm$^2$, preferably 2.2 mA/cm$^2$ to 3.2 mA/cm$^2$, preferably 2.4 mA/cm$^2$ to 3 mA/cm$^2$, preferably 2.6 mA/cm$^2$ to 2.8 mA/cm$^2$, or preferably 2.7 mA/cm$^2$. In a non-limiting example, the surface of the electrocatalyst has an electrochemically active surface area (ECSA) of at least 480 cm$^2$, preferably at least 475 cm$^2$, preferably at least 470 cm$^2$, preferably at least 465 cm$^2$, preferably at least 460 cm$^2$, preferably at least 455 cm$^2$, preferably at least 450 cm$^2$, preferably at least 445 cm$^2$, or at least 440 cm$^2$.

In a non-limiting example, the electrocatalyst has a small charge transfer resistance of from 5Ω to 13Ω, preferably 6Ω to 12Ω, preferably 7Ω to 11Ω, preferably 8Ω to 10Ω, or 10Ω. In a non-limiting example, the electrocatalyst has a double layer capacitance of from 8.5 mF to 10.5 mF, preferably 8.7 mF to 10.3 mF, preferably 8.9 mF to 10.1 mF, preferably 9.1 mF to 9.9 mF, preferably 9.3 mF to 9.7 mF, or 9.5 mF. In a non-limiting example, the electrocatalyst has a mass activity, at a roughness factor of at least 350 mV, of from 650 mA/mg to 3600 mA/mg, preferably 800 mA/mg to 3400 mA/mg, preferably 1000 mA/mg to 3200 mA/mg, preferably 1200 mA/mg to 3000 mA/mg, preferably 1400 mA/mg to 2800 mA/mg, preferably 1600 mA/mg to 2600 mA/mg, preferably 1800 mA/mg to 2400 mA/mg, preferably 2000 mA/mg to 2200 mA/mg, or 2100 mA/mg.

The production of films with AACVD typically operates at pressures ranging from 1 Pascals (Pa) to 50 Pa, preferably 5 Pa to 45 Pa, preferably 10 Pa to 40 Pa, preferably 15 Pa to 35 Pa, preferably 20 Pa to 30 Pa, or 25 Pa. The production of films with AACVD typically operates at gas flow rates ranging from 1 liter/minute (L/min) to 10 L/min, preferably 2 L/min to 9 L/min, preferably 3 L/min to 8 L/min, preferably 4 L/min to 7 L/min, preferably 5 L/min to 6 L/min or 5.5 L/min. In certain embodiments, the gas operated with AACVD is typically inert, suh as helium, neon, argon, krypton, xenon, radon, nitrogen, or carbon dioxide. In certain embodiments, the cleaning gas operated with a typical AACVD process is $O_2$, $O_3$, CO, $CO_2$, $F_2$, $NF_3$, $Cl_2$, $Br_2$, I, ClF, $ClF_2$, $ClF_3$, IF, $IF_2$, $IF_3$, BrF, $BrF_2$, or $BrF_3$.

Examples

The following examples describe and demonstrate exemplary embodiments of the method of preparing NiPd nanoalloy electrocatalyst by AACVD for water splitting reaction described herein. The examples are provided solely for the purpose of illustration and are not to be construed as limitations of the present disclosure, as many variations thereof are possible without departing from the spirit and scope of the present disclosure.

Experimental

Materials and Reagents

The chemicals Pd(II)acetylacetonate, (Pd($C_5H_7O_2$)$_2$) (99.0%), and Ni(II)acetylacetonate (Ni($C_5H_7O_2$)$_2$) (95.0%) were purchased from Sigma Aldrich were used as received without following any purification step (unless otherwise noted) as precursors for the synthesis of NiPd alloy thin films. Methanol and toluene obtained from Sigma-Aldrich were used as solvents. $IrO_2$ nanoparticles purchased from Aldrich was used as received without any purification step. The nickel foam sheet (93% porosity) purchased from the Goodfellow company was employed as the substrate.

Example 1: Fabrication of Catalyst Film

Figure 2:
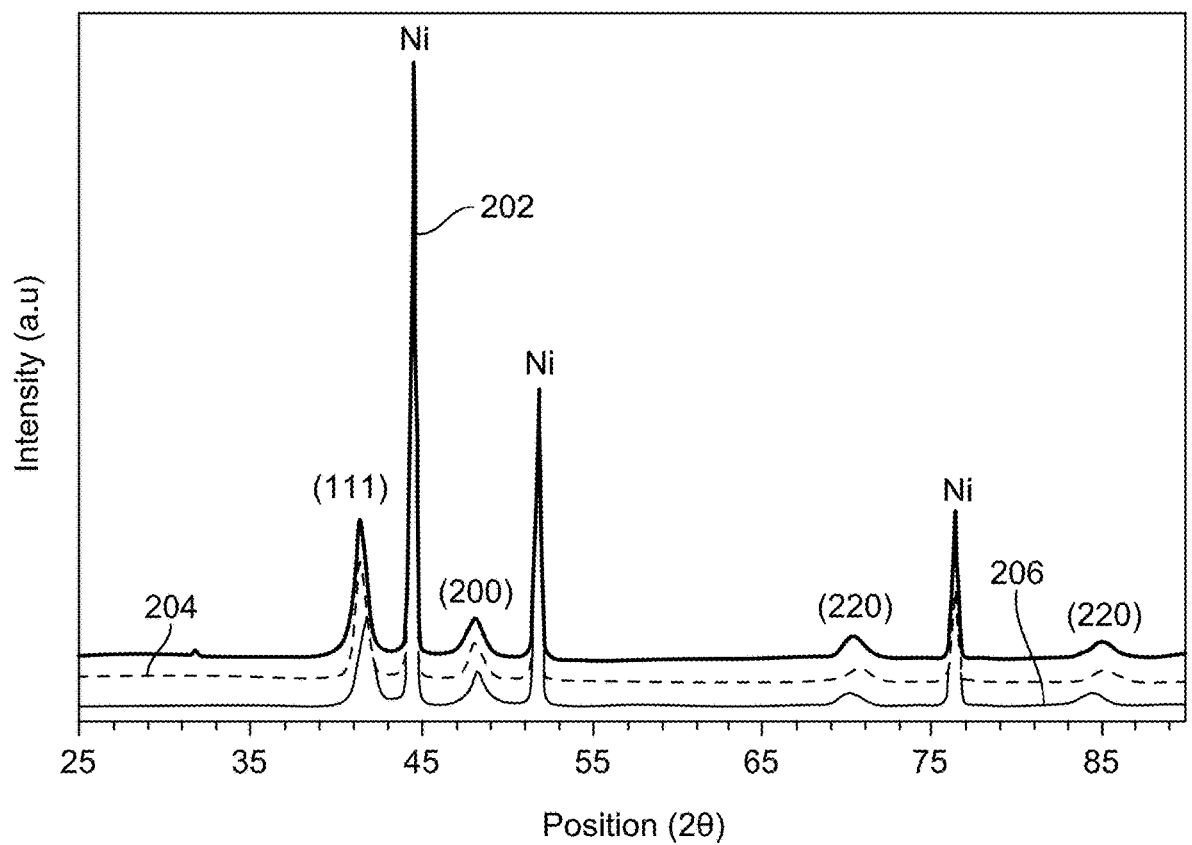
FIG. 2 is an X-ray diffraction (XRD) pattern of cubic phased NiPd alloy samples fabricated on NF substrate for different deposition times, according to certain embodiments.

NiPd catalytic films were prepared using conventional aerosol-assisted chemical vapor deposition (AACVD), as reported in the literature. The dual precursors, $Pd(C_5H_7O_2)_2$ (60 mg, 0.2 mmol) and $Ni(C_5H_7O_2)_2$ (50 mg, 0.2 mmol), were dissolved in 20 ml of methanol/toluene solvent mixture to obtain a transparent yellowish-green solution. The solution was utilized in AACVD. The NiPd catalyst was directly deposited on a nickel foam substrate of size (1.0 cm×2.0 cm) at a temperature of 475° C. The mass loadings of the catalyst were varied by changing the deposition time from 60 to 180 minutes, as illustrated in FIG. 2.

In a conventional AACVD experiment, a two-neck flask having precursor solution was placed in an ultrasonic humidifier. The solution mist produced upon ultrasonic vibration was transferred into the quartz reactor tube placed inside a tube furnace. An inert gas ($N_2$) at a flow rate of 120 $cm^3$/min was supplied to transfer the precursor aerosol mist into the reactor tube. The nickel foam (NF) substrate was placed inside the reactor tube in the heating zone, and the temperature of the furnace was set to 475° C. The deposition was observed for different periods of 60 min, 120 min, and 180 min, and the obtained samples were labeled as $NiPd@NF_{60}$, $NiPd@NF_{120}$, and $NiPd@NF_{180}$, respectively.

Example 2: Catalysts Surface Characterization

A benchtop X-ray diffraction (XRD) on a Rigaku Mini-Flex X-ray diffractometer (Japan) using Cu Kα1 radiation (α=0.15416 nm) was used to record the XRD patterns. The thin film morphologies were examined on a dual-beam FE-SEM TESCAN Lyra 3. Elemental detection was performed using energy dispersion X-ray spectroscopy (EDX) on EDX, INCA Energy 200, Oxford Instrument. A field emission transmission electron microscope (FE-TEM) (JEOL-JEM2100F, Japan) operated at an accelerating voltage of 200 KV was employed to examine the thin film microstructure. The oxidation and chemical states of the elements were investigated with the X-ray photoelectron spectroscopy (XPS) technique (Thermo Fisher Scientific, model: ESCALAB250Xi, USA).

Example 3: Electrochemical OER Studies

The electrochemical investigations were accomplished using computer-controlled Gamry INTERFACE 1010 E Potentiostat as an electrochemical work station. OER reactions were performed in a conventional three-electrode glass cell. Pt mesh, an Ag/AgCl and Hg/HgO, and NiPd catalyst served as the counter, reference, and working electrodes, respectively. The 1.0 M KOH solution (pH=13.9) was used as an electrolyte. Before electrochemical measurements, the electrochemical cell is cleaned by boiling in a 20% solution of $HNO_3$, followed by rinsing many times with ultrapure water and further drying in the oven at 80° C. for 1 hour.
Scale conversion: The potential values have been mentioned in the RHE scale by using the equation:

$$E(RHE)=E_{(ref)}+0.0591 \times pH+0.197, \quad \text{(Eq. 1)}$$

where, $E_{ref}$ is potential recorded against the reference electrode.

Further, electrochemical experiments such as cyclic voltammetry (CV), linear sweep voltammetry (LSV) and chronopotentiometry (CP), and electrochemical impedance spectroscopy (EIS) were performed to establish the OER performances of the Ni—Pd catalyst. All the current values were normalized to the geometrical area of the working electrode.

IR correction: To reduce the effect of solution resistance, all electrochemical data are presented with 10% IR (otherwise mentioned) using the following relation. For ohmic drop correction, solution resistance is obtained from the Nyquist plot.

$$E_{actual}-IR_s=E_{corrected}, \quad \text{(Eq. 2)}$$

where $E_{actual}$ is potential recorded versus Ag/AgCl and Hg/HgO.

Tafel slope calculations: Tafel plot was acquired considering the linear region of the polarization curve recorded at a low scan rate. Tafel slope was obtained by the following relation.

$$\eta=b \text{ Log } j+a, \quad \text{(Eq. 3)}$$

where b is the Tafel slope, and a is constant.

Turn over frequency calculation: Turn over frequency was calculated using a standard equation at various potentials directly observed from the polarization curve.

Exchange current density: Exchange current density of all electrocatalysts was calculated considering charge transfer resistance at electrode-electrocatalyst/electrolyte interphase using the following relation.

$$J_{exc}=RT/nAF\theta, \quad \text{(Eq. 4)}$$

where R stands for the universal gas constant of 8.314 J $(kg \cdot m^2 \cdot s^{-2})$/K. mol T for the temperature of 298 K, n for the number of electrons in the oxygen evolution reaction, F for the Faraday constant of 96485 C (A·s)/mol, A for charge transfer resistance $(kg \cdot m^2 \cdot s^{-3} A^{-2})$, and A for the geometrical area of the working electrodes of 1 $cm^2$.

Mass activity: Mass activity of all electrocatalysts was calculated considering the deposited mass of catalysts (it is assumed that all Ni, Pd metal sites are catalytically active) over NF using the following relation.

$$MA=J_{\eta@350}/\text{mass of catalyst}. \quad \text{(Eq. 5)}$$

Electrochemically active surface area (EASA): EASA was calculated by taking consecutive CVs in the non-faradaic region of the polarization curve at various sweep rates from 10 to 60 mV/s. Anodic and cathodic current plotted against scan rate and linear fitting giving slopes. Averaging the anodic and cathodic slopes gives the value of double-layer capacitance. Dividing double-layer capacitance with a specific capacitance of metal electrodes in alkaline solution ultimately gave the ECSA.

$$C_{dl}/C_s. \quad \text{(Eq. 6)}$$

where $C_s$ is the specific capacitance of metal electrodes in the alkaline electrolyte that id 0.04 $cm^2$.

Roughness factor: The roughness factor was obtained by dividing the electrochemically active surface area by the geometrical area of the working electrode, which is 1 $cm^2$.

$$RF=ECSA/A_{geo}. \quad \text{(Eq. 7)}$$

Specific activity: The intrinsic activity of the catalyst was evaluated by knowing about the specific activity of electrodes. $J_s$ is calculated as follows:

$$J_s=J_{\eta@350}/RF. \quad \text{(Eq. 8)}$$

Electrochemical impedance spectroscopy (EIS): EIS was employed to study charge transfer resistance and solution resistance. Nyquist plots were acquired at 1.45 V (vs. RHE), considering the frequency range from 0.1 Hz to 100000 Hz. Corresponding solution resistance and charge transfer resistance values are calculated by fitting a simplified Randles circuit.

Extended period water electrolysis experiments: For the durability test, chronopotentiometry or controlled-current electrolysis measurements were carried out at two different current values, such as 10 mA $cm^{-2}$ and 20 mA $cm^{-2}$ over several hours.

Results and Discussion

Structure and Morphology

After catalysts fabrication, they were fully characterized by various analytical techniques to recognize the structural, morphological, and chemical properties. XRD analysis was performed to study catalyst structure and phase. FIG. 2 depicts the XRD patterns of three NiPd alloy samples, namely NiPd-1 h (202), NiPd-2 h (204), and NiPd-3 h (206) directly prepared on nickel foam. The four distinct hkl reflections, including (111), (200), (220), and (220) at 2θ position 41.5°, 48.4°, 70.7°, and 84.8°, respectively, belong to the cubic phased nickel-palladium "NiPd" as verified by matching with standard PDF(03-065-9444) pattern. The high-intensity peaks originating from NF substrate are indicated with "Ni." No extra peak relevant to metallic Pd or any other phase of NiPd is determined from XRD patterns, and Ni—Pd appears as the only crystalline product in all three samples.

Figure 3A:
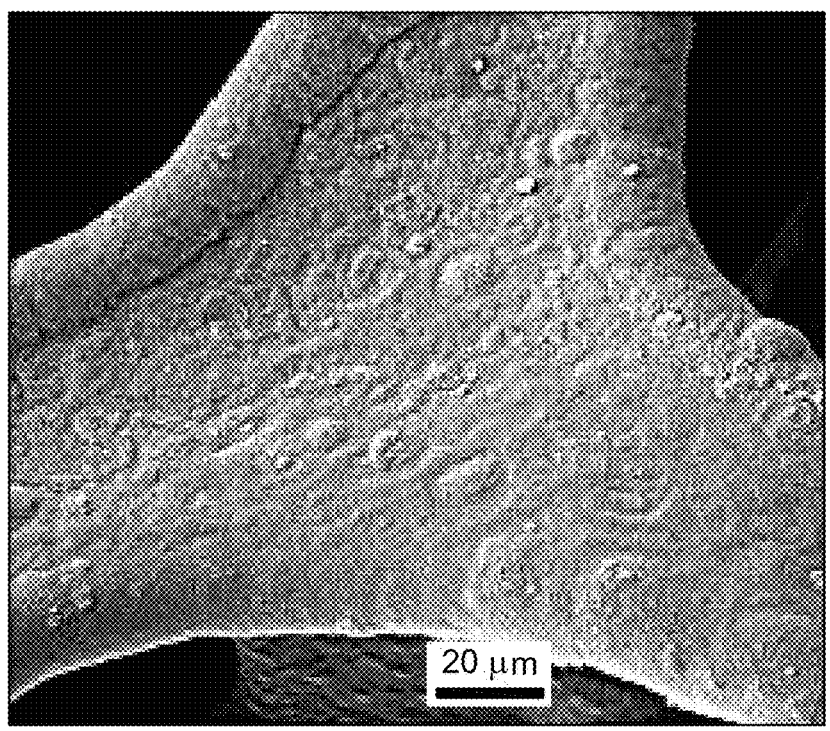
FIG. 3A, FIG. 3C, and FIG. 3E show a low-resolution field emission scanning electron microscope (FESEM) image for NiPd@$NF_{60}$, NiPd@$NF_{120}$, and NiPd@$NF_{180}$ samples according to certain embodiments.
Figure 3B:
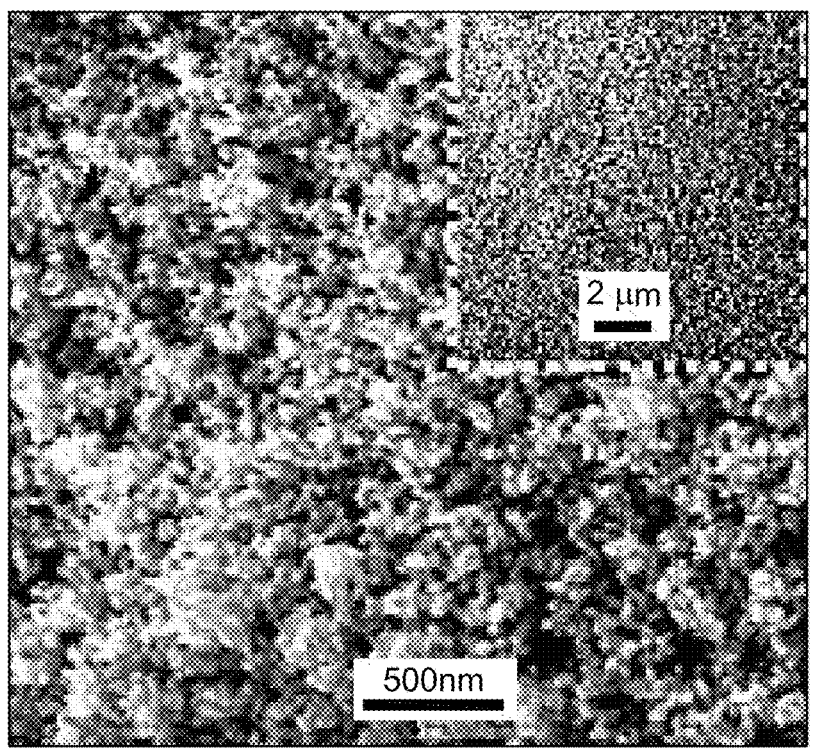
FIGS. 3B, FIG. 3D, and FIG. 3F show high-resolution FESEM images for NiPd@$NF_{60}$, NiPd@$NF_{120}$, and NiPd@NF 180 samples according to certain embodiments.
Figure 3C:
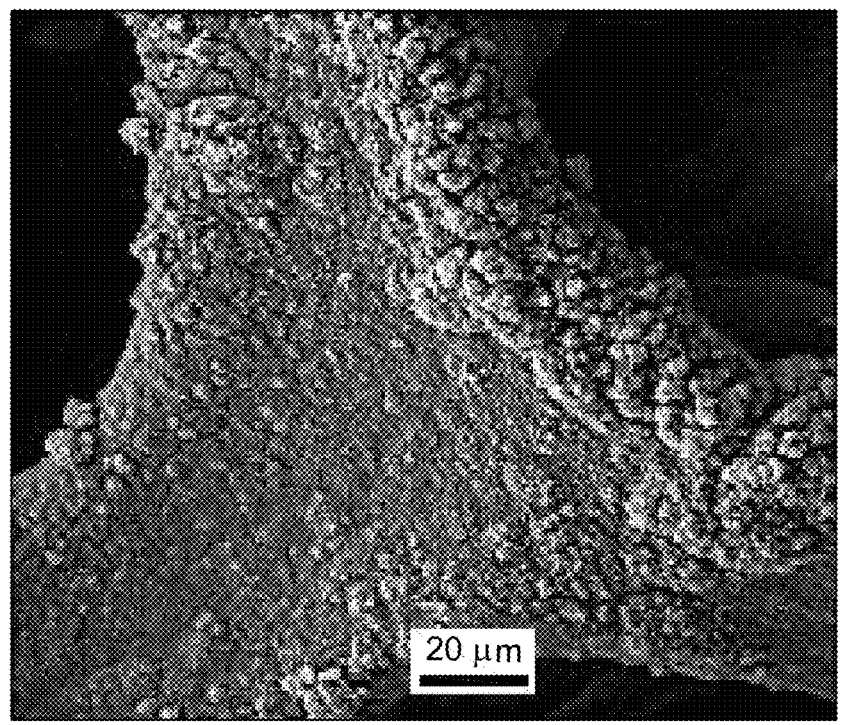
Figure 3D:
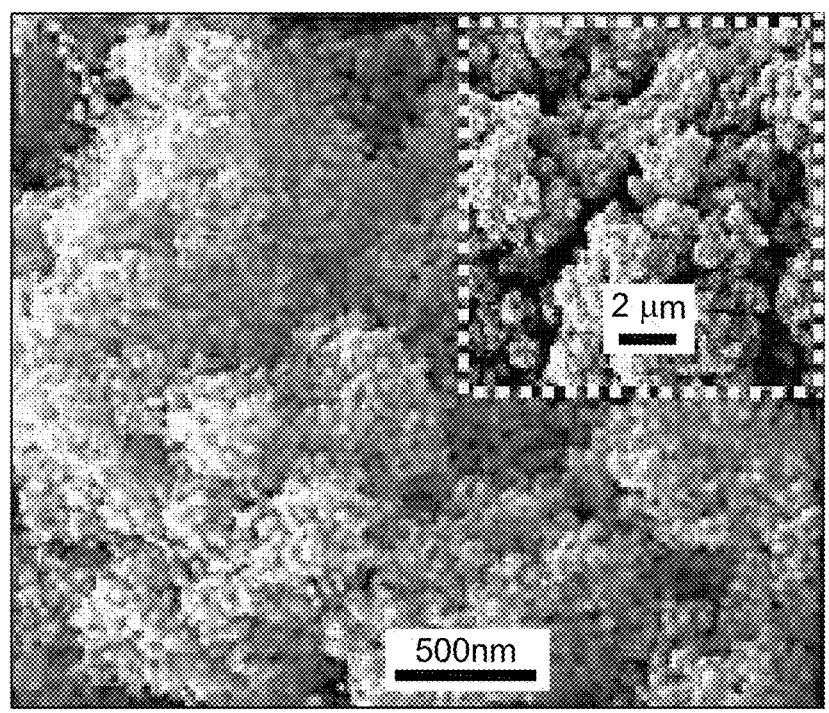
Figure 3E:
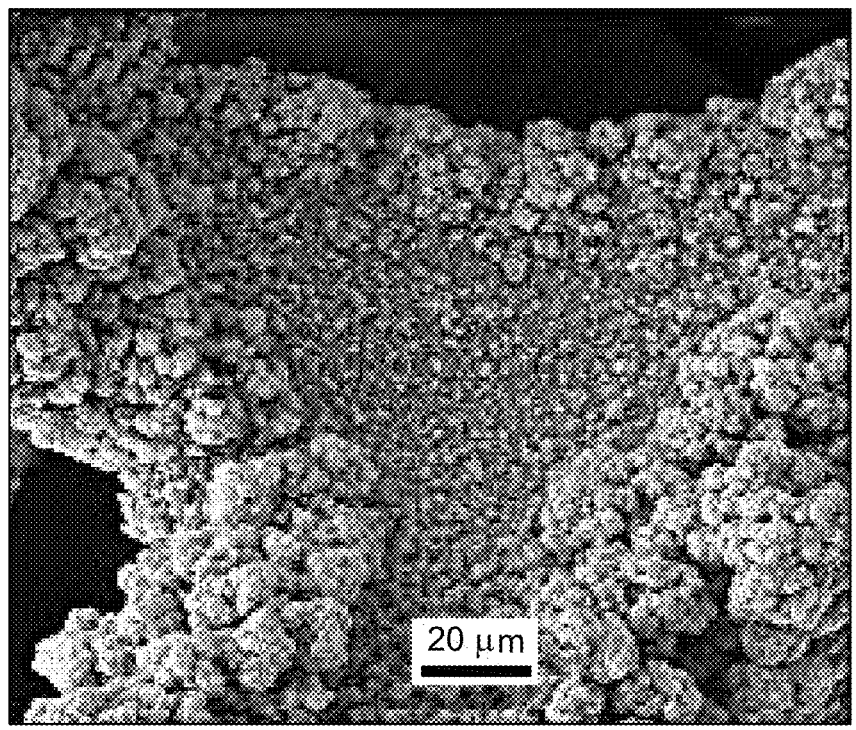
Figure 3F:
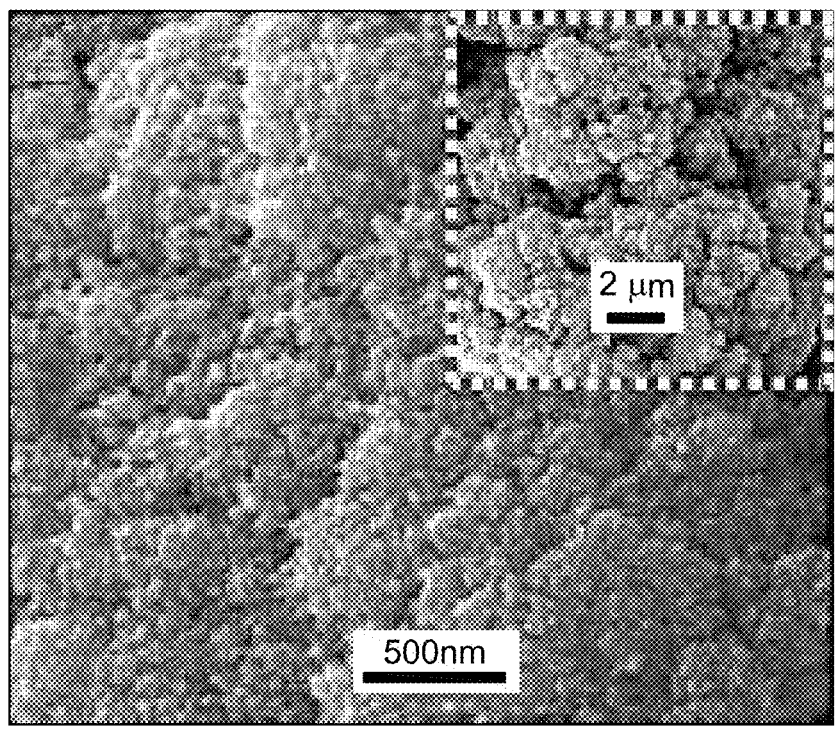

Further, the morphology of developed films was studied by FE-SEM analysis. The FESEM images showing the growth of Ni—Pd on NF with the deposition time from 60 to 180 minutes, are illustrated In FIG. 3. The low magnification images, FIGS. 3A, 3C, and 3E, for NiPd@NF samples, reveal that the deposited mass continued to grow with time and, within 180 minutes, evolved into large chunks of nanoparticles. The high-resolution FESEM images, as indicated in FIGS. 3B, 3D, and 3F revealed detailed morphological patterns of Ni—Pd alloy. From the FIG. 3B, it was evident that a uniform layer of nanoparticles, rising upwards, was obtained during the first hour of deposition. When sintering time was extended to 120 minutes, these nanoparticles accumulated and evolved into a heap of spherical beads (FIG. 3D). As the deposition time increased to 180 minutes, the sintering effect became more pronounced, and particles coalesced to form a compact thin film layer, as shown in FIG. 3F. One of the prime advantages of AACVD is that morphology patterns and size can be easily tuned by altering the growth periods.

Figure 4A:
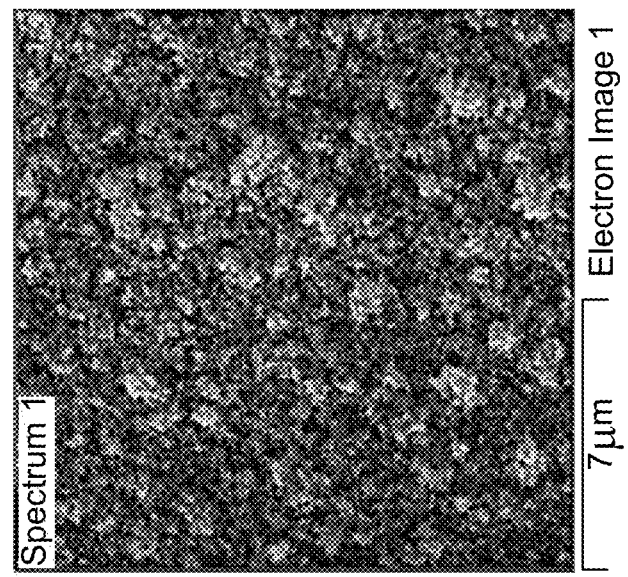
FIG. 4A shows Energy-dispersive X-ray spectroscopy (EDX) spectra of single-phase NiPd@$NF_{60}$ samples with measured % atomic concentration of Ni and Pd, according to certain embodiments.
Figure 4A:
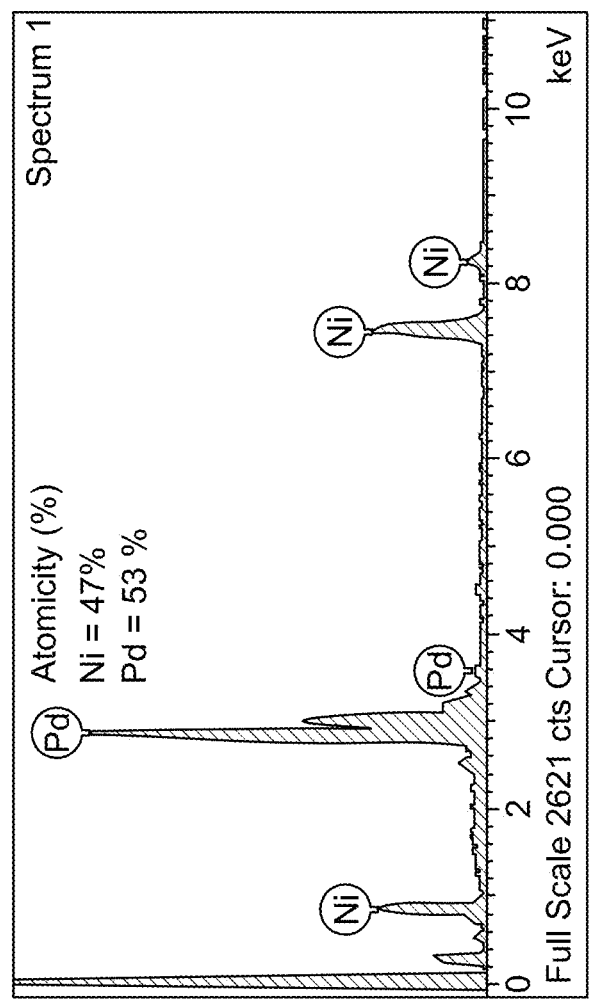
Figure 4B:
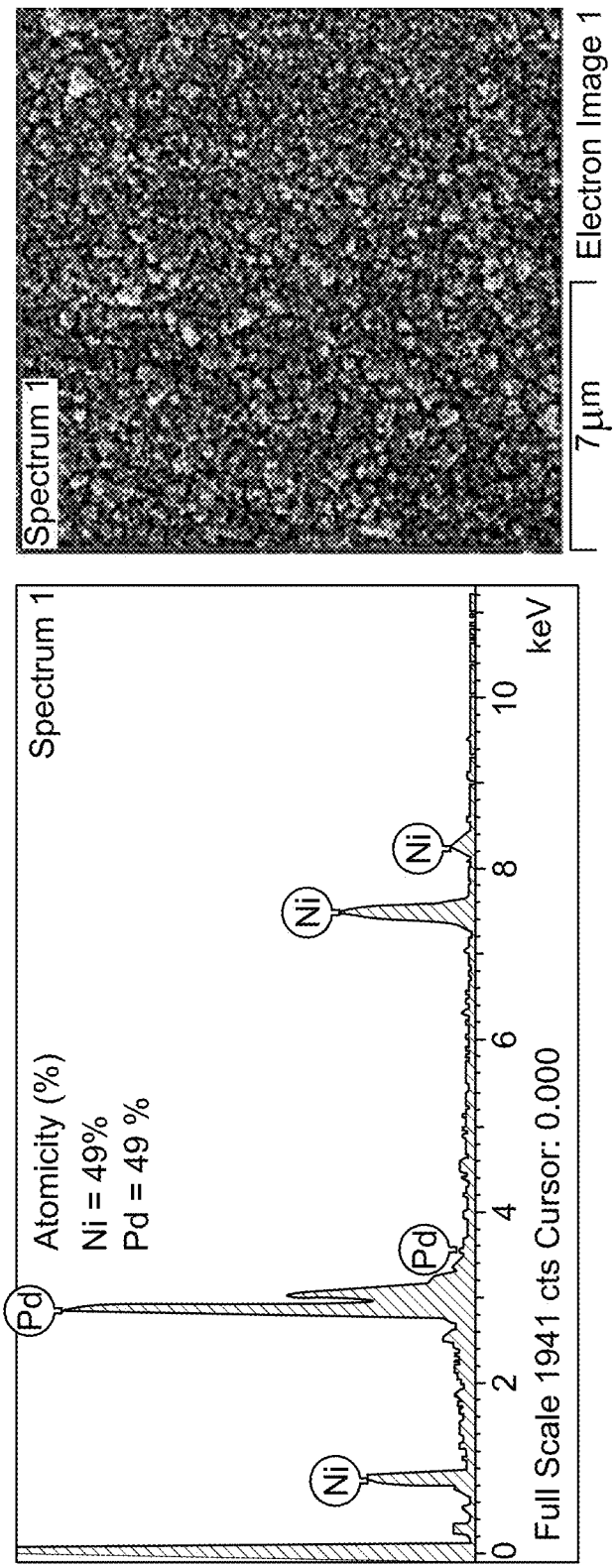
FIG. 4B shows an EDX spectrum of single-phase NiPd@$NF_{120}$ samples with measured % atomic concentration of Ni and Pd, according to certain embodiments.
Figure 4C:
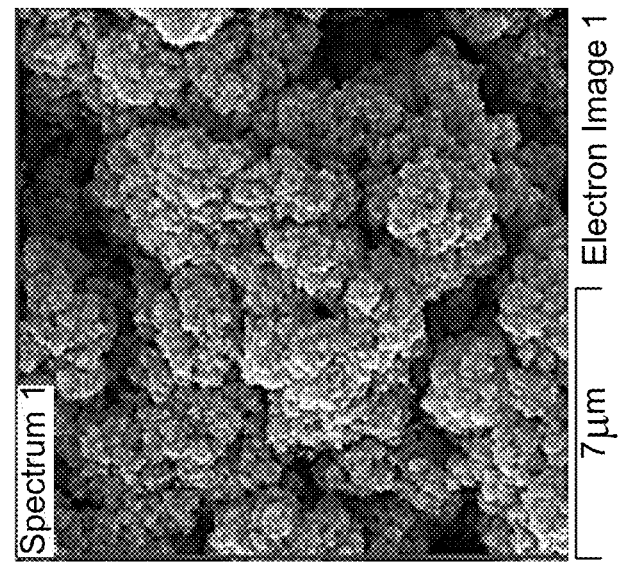
FIG. 4C shows an EDX spectrum of single-phase NiPd@$NF_{180}$ samples with measured % atomic concentration of Ni and Pd, according to certain embodiments.
Figure 4C:
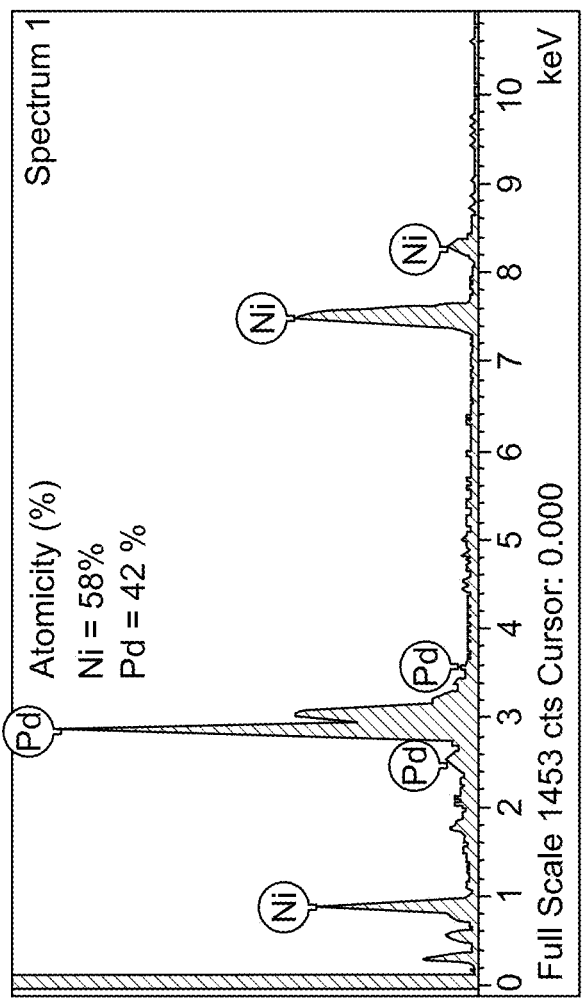

The elemental compositions in NiPd samples were investigated using EDX analysis. Since the samples were deposited on the NF substrate, the atomic concentration of Ni was expected to be high due to the atomic contributions of nickel from the underlying NF substrate. The alloy films were reproduced on a plane glass substrate to determine the real atomic concentration of Ni and Pd in the NiPd samples. FIGS. 4A-4C indicates the EDX spectra of all three samples with the measured percentage atomicity of Ni/Pd, which was found to be in a ratio of 1:1 ratio in NiPd@$NF_{60}$ NiPd@$NF_{120}$ samples (FIGS. 4A and 4B, respectively). However, this ratio was disturbed in the NiPd@$NF_{180}$ sample (FIG. 4C), where Ni concentration was observed to be increased with Pd. Overall, all three samples exhibited similar crystalline single phased "Ni—Pd" as the final product predicted from the XRD analysis.

Figure 5A:
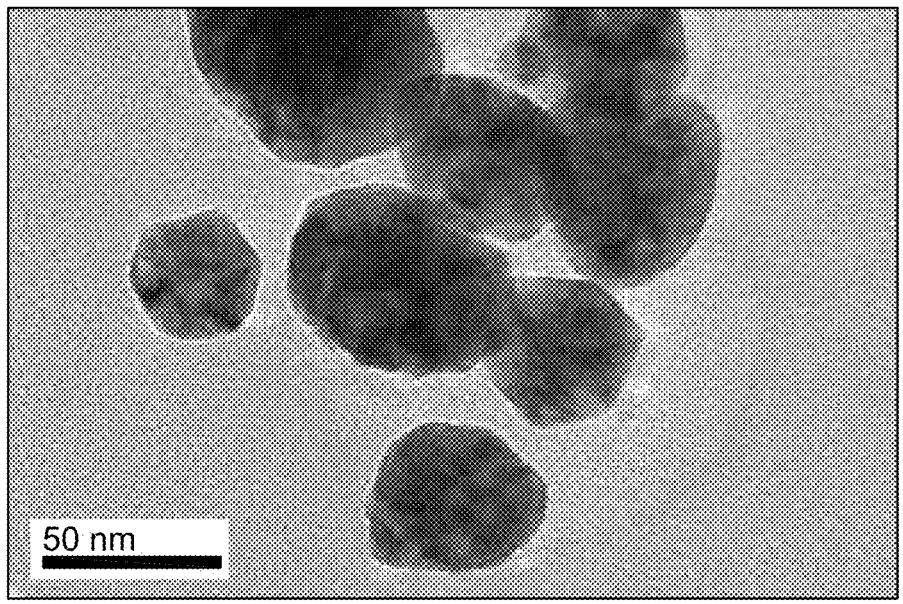
FIGS. 5A and 5B show a transmission electron microscope (TEM) analysis of the NiPd@$NF_{120}$ sample at 500 nm, according to certain embodiments.
Figure 5B:
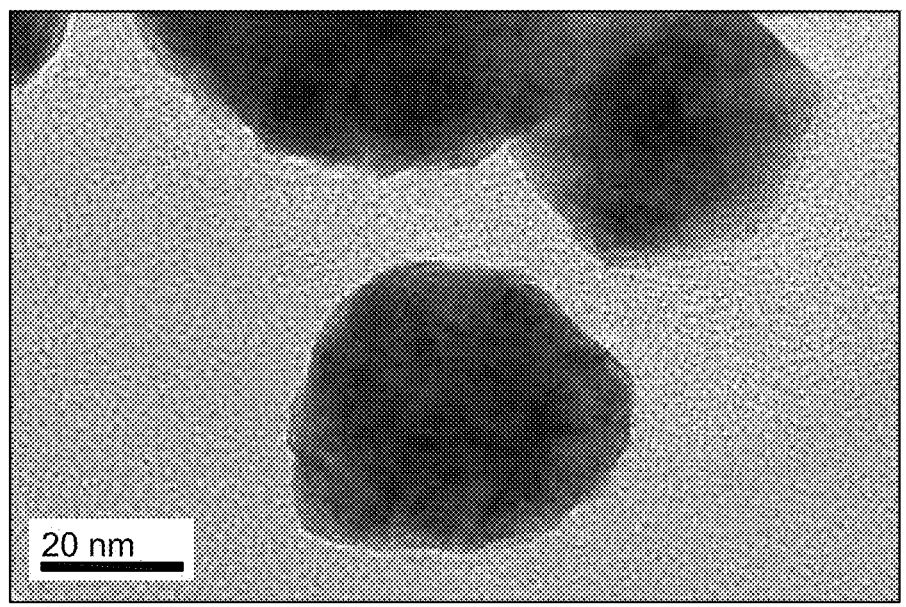
Figure 5C:
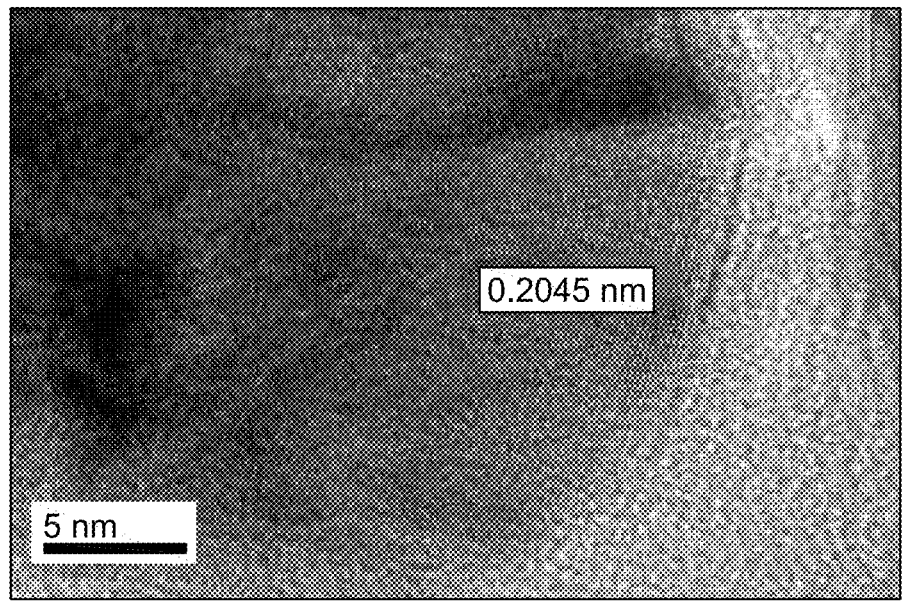
FIG. 5C shows a high-resolution transmission electron microscope (HR-TEM) at 5 nm presenting the lattice fringes of NiPd@$NF_{120}$, according to certain embodiments.
Figure 5D:
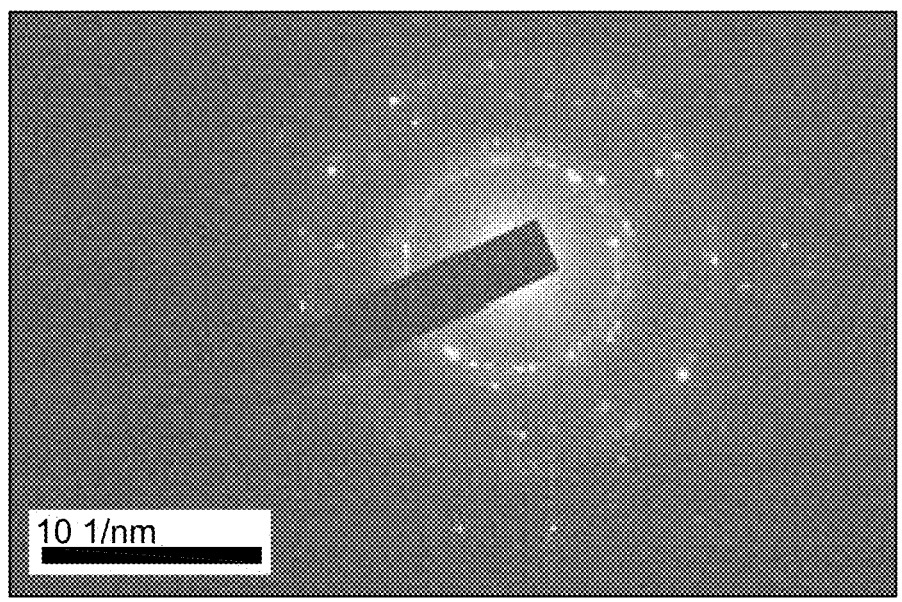
FIG. 5D shows a selected area (electron) diffraction (SAED) showing the ring formation for a polycrystalline NiPd@$NF_{120}$, according to certain embodiments.

Further insight into the morphology and crystalline structure was obtained by analyzing the NiPd@$NF_{120}$ sample with a transmission electron microscope (TEM). FIGS. 5A and 5B indicate the typical TEM micrograph of NiPd@$NF_{120}$, which demonstrates that the size of nanoparticles in a longest dimension exists in the range of 20-50 nm and many nano-crystallites are stacked together. The high resolution-transmission electron microscope (HR-TEM) image (FIG. 5C) revealed multiple fringes on the surface of nano-crystallite. The inter-planar distance (d-spacing) between lattice fringes was measured to be 0.20 nm which agreed well with the d-spacing, 0.21 nm identified for 100% intensity peak (111) of single phased cubic "NiPd" from XRD analysis. Besides the typical diffraction rings in the selected area electron diffraction (SAED) pattern, FIG. 5D demonstrates the polycrystalline nature of NiPd nano-alloy (NiPd@$NF_{120}$) prepared by the straightforward AACVD technique.

Figure 6A:
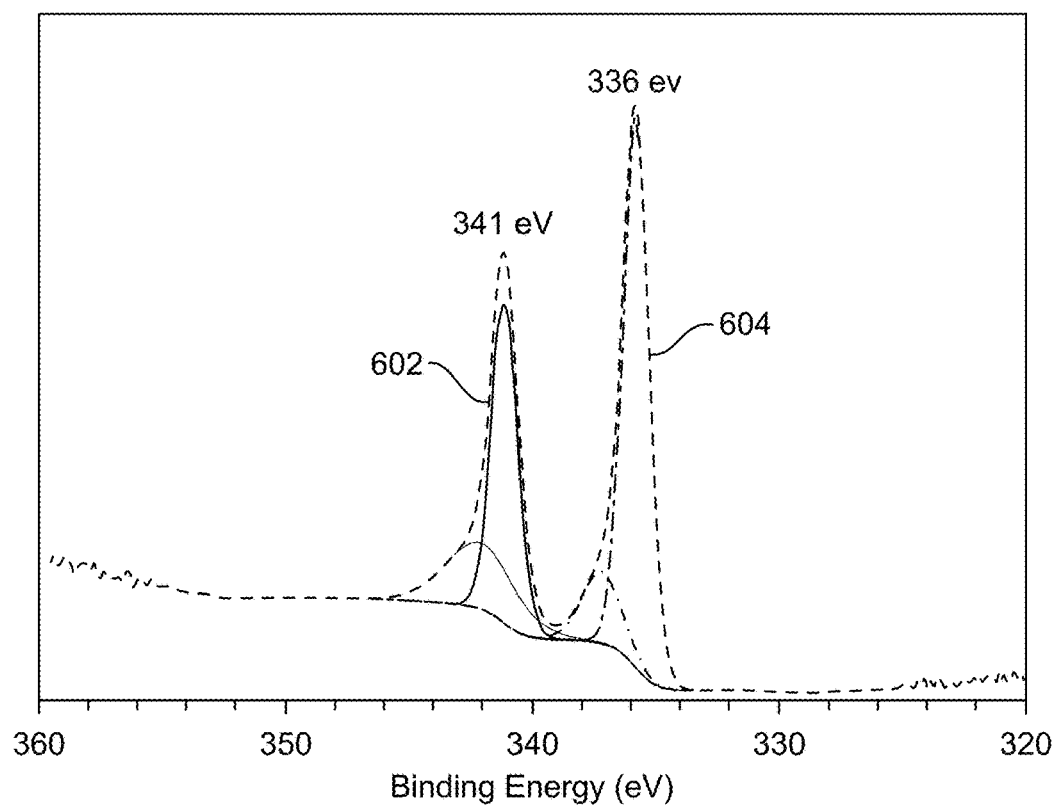
FIG. 6A shows a high-resolution deconvoluted X-ray photoelectron spectroscopy (XPS) spectrum of a single-phase NiPd sample fabricated for 120 minutes (NiPd@$NF_{120}$), according to certain embodiments.

Further, the chemical structure and possible oxidation states of metals in NiPd nano-alloy X-ray photoelectron spectroscopy (XPS) analysis were determined. FIG. 6 indicates the XPS spectra of a single-phase NiPd sample fabricated for 120 minutes (NiPd@$NF_{120}$). FIG. 6A reveals the high-resolution deconvoluted spectrum of Pd 3d. The doublet peaks fitted at binding energies 336 eV and 341 eV are assigned to the Pd $3d_{5/2}$ (602) and Pd $3d_{3/2}$ (604) orbitals, respectively. The electronic spectrum implied Pd's zero (0) oxidation state in metallic form.

Figure 6B:
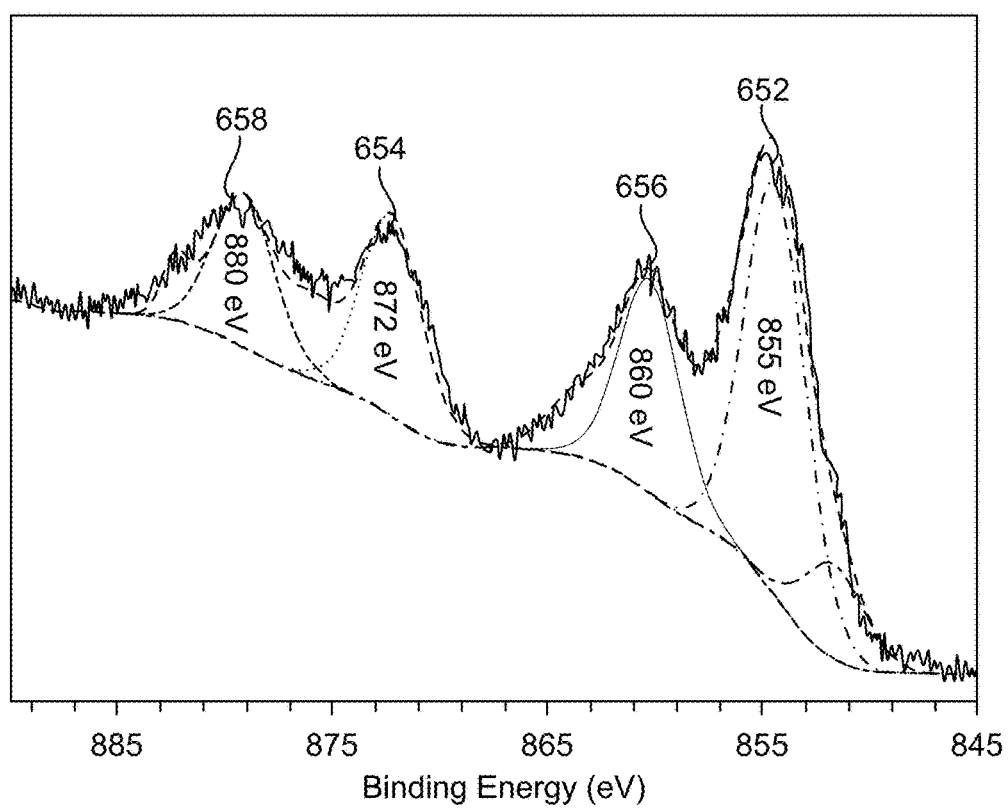
FIG. 6B shows a high-resolution deconvoluted XPS spectra spectrum of Ni 2p fitted with metallic nickel, according to certain embodiments.

FIG. 6B depicts the high-resolution spectrum of Ni 2p and is well-fitted with metallic nickel. The peaks at binding energies of 855 eV and 872 eV are associated with Ni $p_{3/2}$ (652) and Ni $p_{1/2}$ (654) orbitals, respectively. The corresponding satellite peaks of Ni $2p_{3/2}$ (656) and Ni $2p_{1/2}$ (658) at 860 eV and 880 eV, respectively, denote the zero (0) oxidation state of Ni. Thus, XPS results confirm that the Pd and Ni elements are present in metallic forms in single-phase NiPd nano-alloy.

OER Studies

OER characteristics are primarily evaluated based on cyclic voltammetry (CV) analysis. CV generally provides information about the redox reactions occurring on the catalyst's surface under the applied potential range and provides a general idea about the stability of catalysts in certain electrochemical conditions. CV study also aids in activating the metal sites of the electrocatalyst.

Figure 7A:
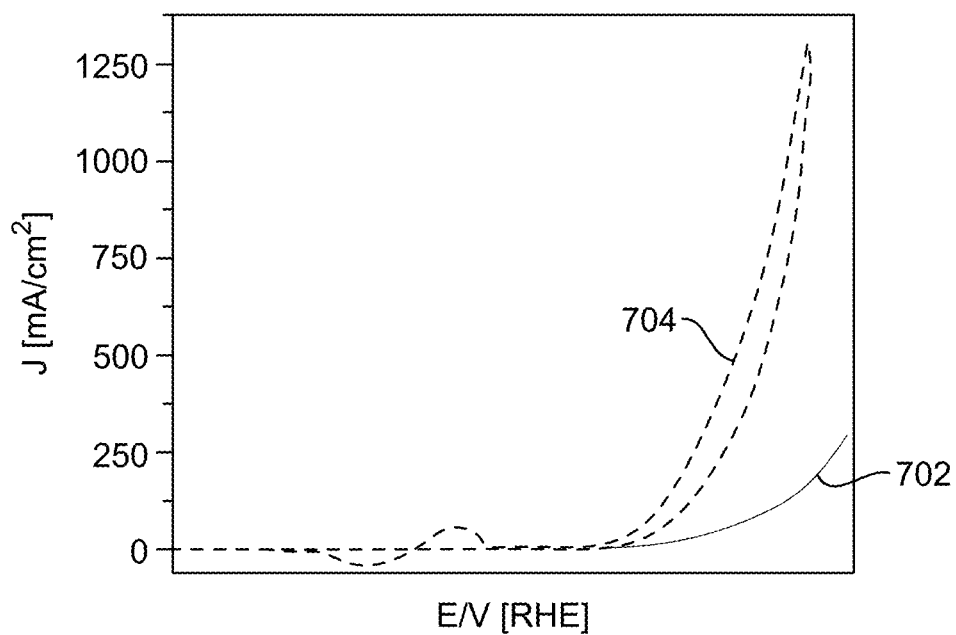
FIG. 7A. is a cyclic voltammogram (CV) showing concurrent $1^{st}$ and 40th cyclic voltammetry curves for NiPd/$NF_{60}$ recorded at a scan rate of 50 mV $sec^{-1}$ in 1.0 M KOH electrolyte solution, according to certain embodiments.
Figure 7B:
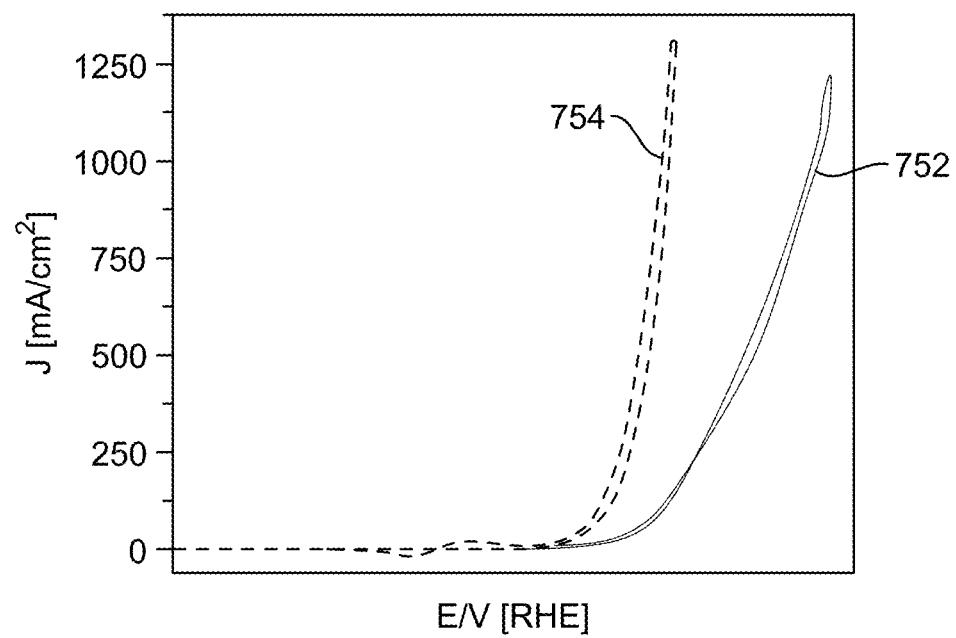
FIG. 7B. is a CV showing concurrent 1st, and 40th cyclic voltammetry curves for NiPd/$NF_{120}$ recorded at a scan rate of 50 mV $sec^{-1}$ in 1.0 M KOH electrolyte solution, according to certain embodiments.
Figure 7C:
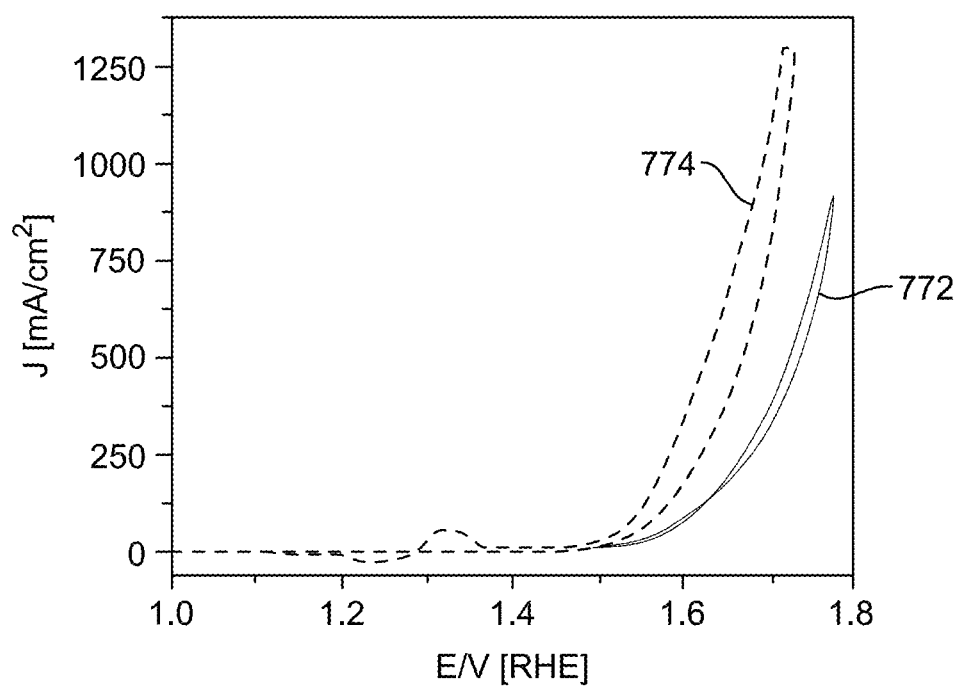
FIG. 7C. is a CV showing concurrent 1st, and 40th cyclic voltammetry curves for NiPd/$NF_{180}$ recorded at a scan rate of 50 mV $sec^{-1}$ in 1.0 M KOH electrolyte solution, according to certain embodiments.

Therefore, concurrent CVs were initially performed to activate the NiPd@NF catalysts to observe their electrochemical activity and stability on nickel foam in a 1.0 M KOH electrolyte solution. All three NiPd electrodes were scanned through continuous CV sweeps until a stable and consistent redox behavior was obtained. FIG. 7A compares the $1^{st}$ CV cycle (702) and the $40^{th}$ CV cycle (704) for NiPd@$NF_{60}$; FIG. 7B indicates a comparison between the $1^{st}$ CV cycle (752) and the $40^{th}$ CV cycle (754) for NiPd@$NF_{120}$; and FIG. 7C compares the $1^{st}$ CV cycle (772) and the $40^{th}$ CV cycle (774) for NiPd@$NF_{180}$. The experiments were conducted at a scan rate of 50 mV/sec. It was observed that CV response in all three cases significantly improved from the $1^{st}$ to the $40^{th}$ cycle. However, the NiPd@$NF_{120}$ achieved the highest current density >1000 mA $cm^{-2}$ at a much lower potential value of 1.59 V (vs. RHE) (FIG. 7B), as compared to the NiPd@$NF_{60}$ and NiPd@$NF_{180}$ that acquired similar current density values at 1.75 V (vs. RHE) (FIG. 7A) and 1.76 V (vs. RHE) (FIG. 7C) respectively.

Another essential feature to be noted in CV curves is the appearance of the anodic peak in the potential range of 1.3 and 1.4 $V_{RHE}$ which was attributed to the formation of higher oxidation species of metals. It can be observed that the anodic peak's amplitude rose as the CV runs progressed. This indicates that the electrochemical oxidation behavior of NiPd electrocatalyst improves owing to the generation of more catalytic active spices on the NF surface. The increase in catalytic sites resulted in improving low over-potential requirements to achieve high current densities during the OER process.

Figure 8A:
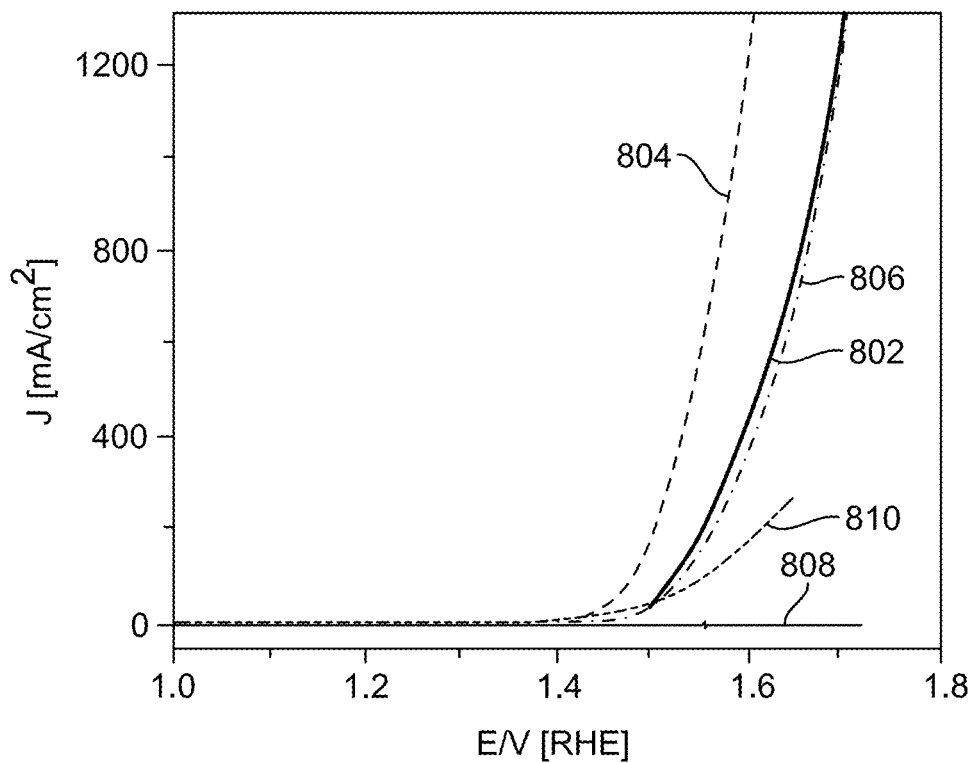
FIG. 8A and FIG. 8B show polarization curves for NiPd catalysts deposited over a nickel foam (NF) at various deposition times obtained at a scan rate of 2 mV/s in 1.0 M KOH electrolyte solution, according to certain embodiments.
Figure 8B:
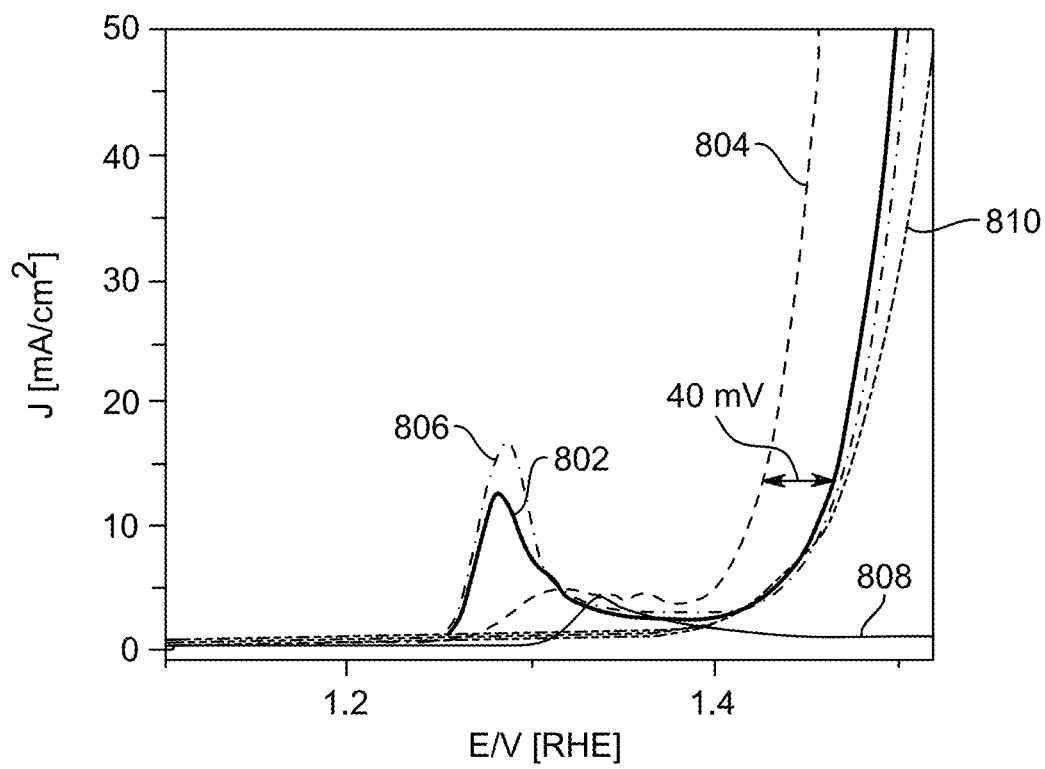
Figure 8C:
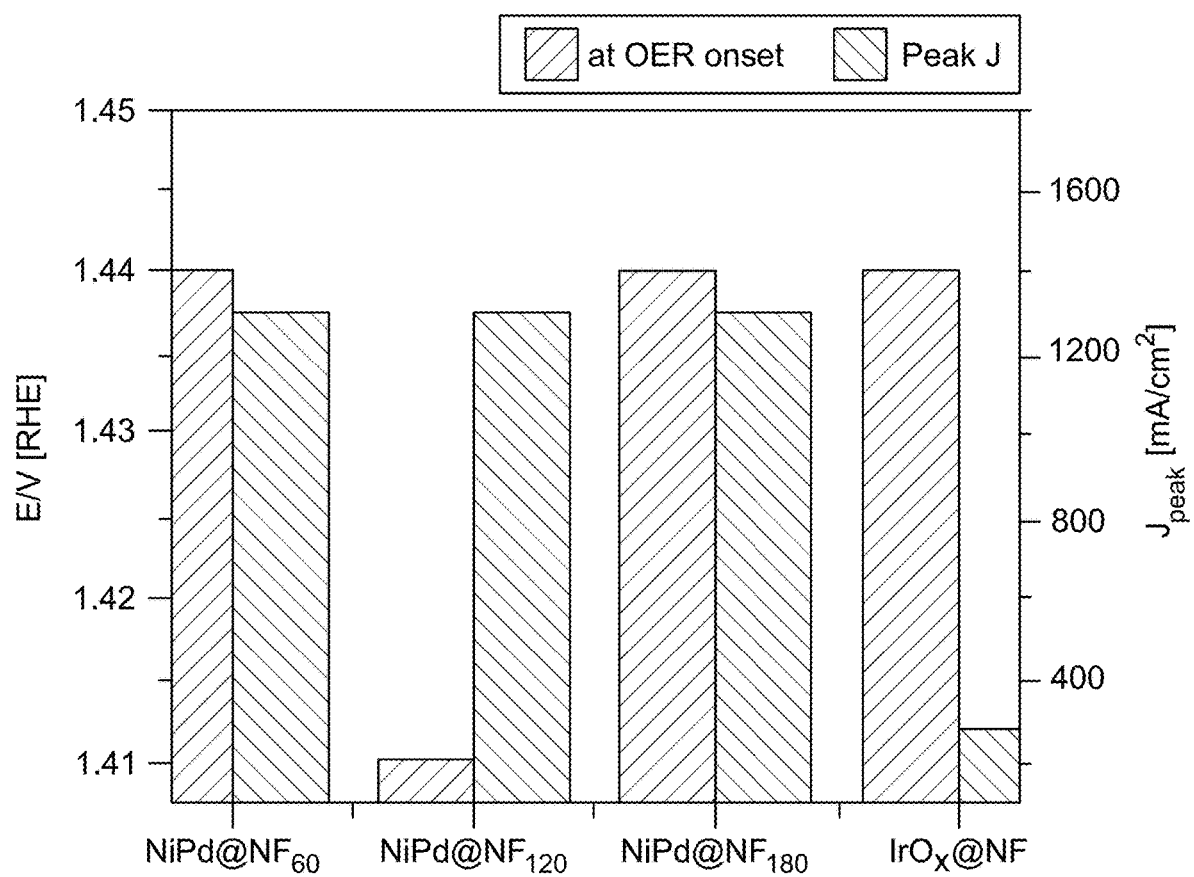
FIG. 8C shows an onset overpotential and peak current density values for different electrodes, according to certain embodiments.

After electro-activation, OER characteristics of all electrocatalysts were primarily evaluated via linear sweep voltammetry (LSV) measurements. FIG. 8A shows the LSV curves recorded at a scan rate of 2 mV/s for electrochemically activated NiPd@NF$_{60}$ (802), NiPd@NF$_{120}$, (804), and NiPd@NF$_{180}$ electrode (806), bare NF (808), and commercial IrO$_2$@NF (810) in 1.0 M KOH solution. The polarization curves reflect the outstanding OER performance of the NiPd@NF$_{120}$ catalyst as compared to other NiPd and IrO$_2$ electrodes. OER was initiated at an extremely low onset potential of just 1.40 V (vs. RHE) ($\eta_{onset}$=170 mV) for NiPd@NF$_{120}$, whereas OER onset potential of NiPd@NF$_{60}$, NiPd@NF$_{180}$, and commercial IrO$_2$@NF is ~1.44 V (vs. RHE) ($\eta_{onset}$=210 mV) (FIGS. 8B and 8C). Furthermore, an enlarged view of LSV curves (FIG. 8B) illustrates that for the NiPd@NF$_{120}$ catalyst, soon after the pre-oxidation peak [1.36 V (vs. RHE)], a catalytic peak readily appeared at a low overpotential of 170 mV (potential difference of pre-oxidation peak potential and OER onset potential is $\Delta\eta$=40 mV). By further sweeping the potential towards the positive range, a quick rise in catalytic current was observed to achieve a peak current density of >1300 mA cm$^{-2}$ at an overpotential of 370 mV. The overpotential calculation of NiVO$_x$/NF electrocatalyst for OER was performed utilizing equation $$\eta = E_{RHE} - 1.23\ V,$$

where $\eta$ accounts for overpotential.

This behavior is advantageous for OER catalysts and corresponds to a faster heterogeneous electron transfer process at the electrode/electrocatalyst surface. For NiPd@NF$_{60}$, NiPd@NF$_{180}$, $\Delta\eta$ (potential difference of pre-oxidation peak potential and OER onset potential) is 160 mV, and a peak current density of >1300 is achieved at 470 mV (FIG. 8C). Comparatively outstanding catalytic performance of NiPd@NF$_{120}$ is due to the formation of more intense nanoparticles over the NF surface by depositing catalyst for 120 minutes, as illustrated in SEM images (FIGS. 3C and 3D, respectively).

Figure 8D:
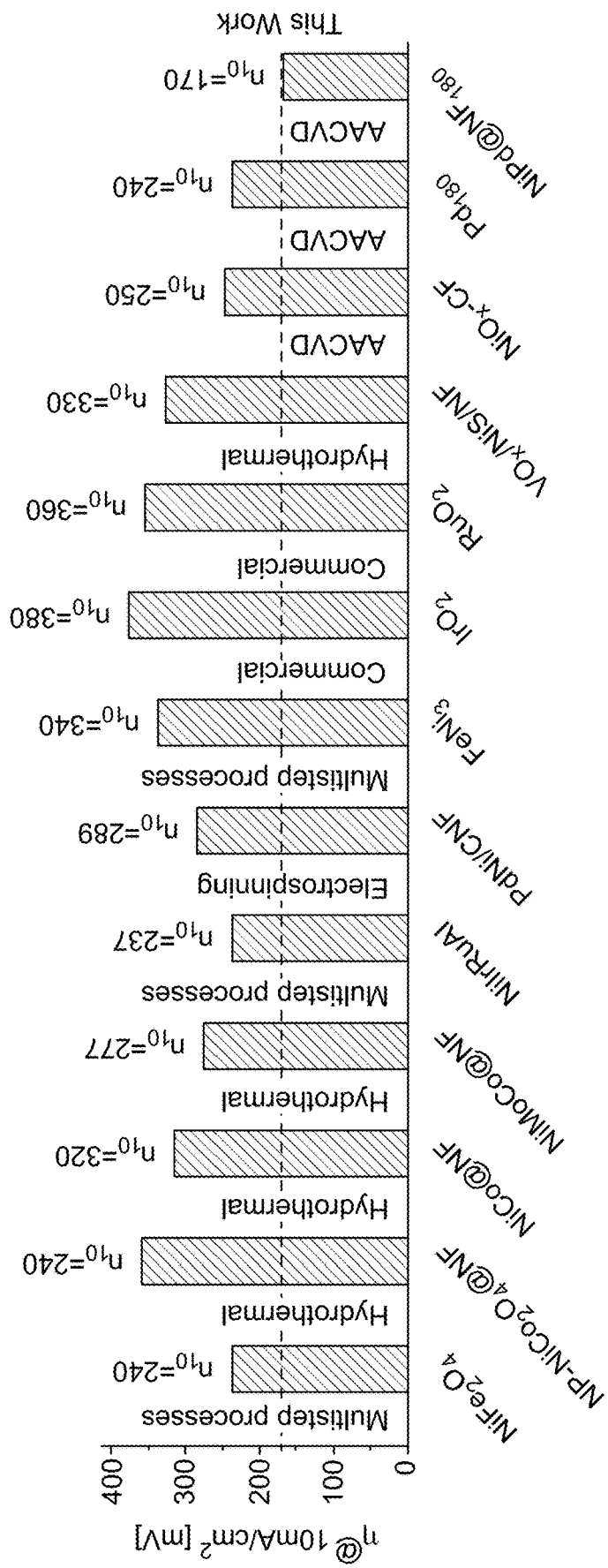
FIG. 8D is a comparison of overpotential to achieved current decade among NiPd@$NF_{120}$ obtainable via AACVD and other reported OER catalysts prepared by various methods, according to certain embodiments.

A sustained current density of 10 mA cm$^{-2}$ at or below 350 mV is a prerequisite for the efficient operating of solar-to-fuel conversion devices. The best performing catalyst achieved a current decade at 180 mV, which is fascinating from an economic perspective and makes the system highly applied. To establish the OER performance, the overpotential values of NiPd@NF$_{120}$ electrocatalyst were obtained via straightforward AACVD technique, and previously published OER electrocatalysts that were prepared by various strategies were compared at a current density of 10 mA cm$^{-2}$ (FIG. 8D). A catalyst producing the current decade at 200-300 mV can be regarded as an ideal catalyst for OER (literature). The NiPd@NF$_{120}$ electrode displayed the current decade at an extremely low overpotential of 180 mV and can be considered an ideal OER catalyst that is simple to prepare under easily controlled reaction conditions. The observed order of OER activity to achieve a current decade is as follows: Bare NF ($\eta_{10}$=410 mV)>NiPd@NF$_{180}$ ($\eta_{10}$=220 mV)=NiPd@NF$_{60}$ ($\eta_{10}$=220 mV)>NiPd@NF$_{120}$ ($\eta_{10}$=180 mV). A similar trend was observed when overpotential $\eta_{500}$ and $\eta_{1000}$ values were compared at a higher current density of 500 mA cm$^{-2}$ and 1000 mA cm$^{-2}$. As expected, NiPd@NF$_{120}$ catalyst displayed the smallest overpotentials of 310 mV and 350 mV in approaching the current density of 500 mA cm$^{-2}$ and 1000 mA cm$^{-2}$ compared to NiPd@NF$_{60}$ and NiPd@NF$_{180}$, achieved 500 mA cm$^{-2}$ at 370 and 390 mV, respectively, and 1000 mA cm$^{-2}$ at 440 mV and 445 mV respectively (FIG. 8A). However, the difference in overpotential values of NiPd@NF$_{60}$ and NiPd@NF$_{180}$ electrodes was not large. It can be noted that the OER performance of NiPd@NF$_{60}$ and NiPd@NF$_{180}$ electrodes are almost similar, and their overpotentials ($\eta_{10}$, $\eta_{500}$, and $\eta_{1000}$) and current densities values are also comparable. This study shows that all NiPd-based catalysts outperform commercial IrO$_2$@NF and produce a comparatively 4-fold high current density within a narrow potential range under employed electrochemical conditions.

Figure 9:
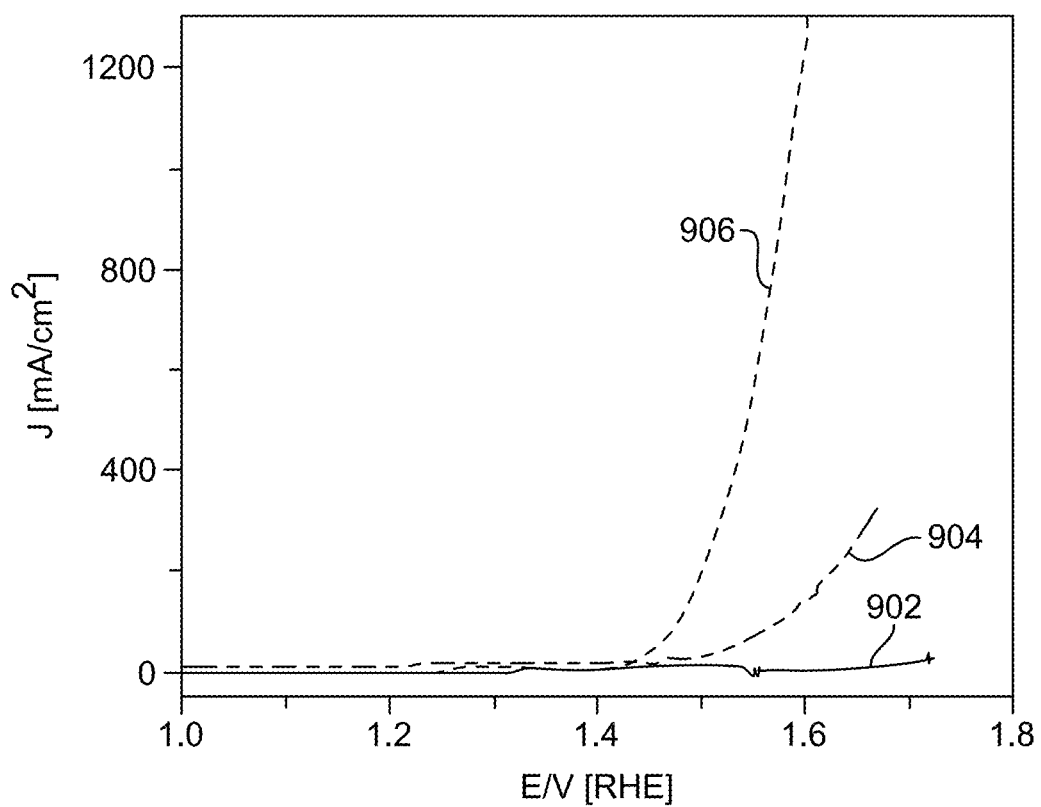
FIG. 9 shows a linear sweep voltammetry (SLAV) curve for NF, Pd@$NF_{60}$, and NiPd@$NF_{120}$ recorded at a scan rate of 2 mV/s in 1.0 M KOH solution.

NiPd-based catalytic systems can be highly applied for large-scale employment. This high catalytic activity for OER at low overpotentials is ascribed to the synergistic effect of Ni and Pd in NiPd alloy. To validate this concept, a simple monometallic Pd-based electrocatalyst is also prepared by following the AACVD method depositing precursors over NF for 120 minutes and tested for OER under similar electrochemical conditions. FIG. 9 depicts LSV curves for NF (902), Pd@NF$_{60}$ (904), and NiPd@NF$_{120}$ (906) recorded at a scan rate of 2 mV/s in 1.0 M KOH solution. LSV shows that onset potential and rim for Pd@NF$_{60}$ (904) is 1.45 V (vs. RHE) [$\eta$=220] and 230 mV. These values are shifted towards a negative potential bias for NiPd@NF$_{120}$ alloy (906). Also, the current density increased by 4-fold for the bimetallic NiPd@NF$_{120}$ catalytic system. Therefore, this intermetallic compound formation is significant for enhancing OER. From this study, it was observed that neither Pd nor Ni from NF is an active material for high activity OER, but the fabricated NiPd nano-alloy-based film with optimum stoichiometry could dynamically accelerate OER at low overpotential, making the catalyst economical. Adding cost-effective Ni in NiPd nano-alloy enhances the catalytic activity and reduces the overall cost of the catalytic system, thus making it industrially viable.

Figure 10A:
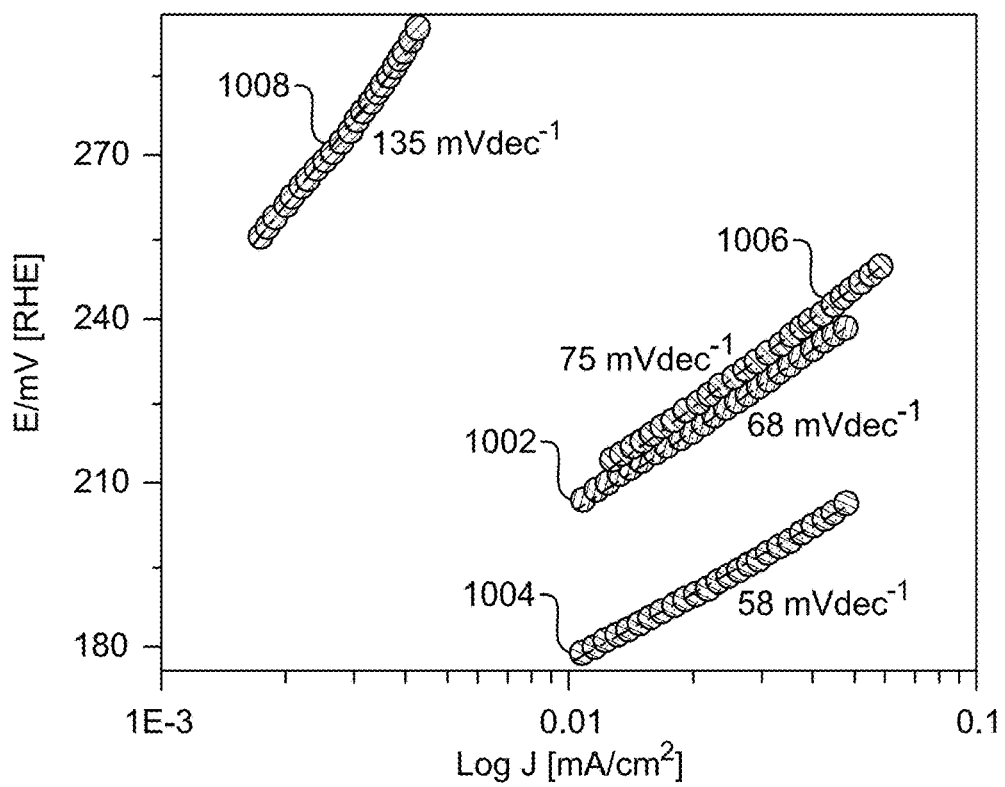
FIG. 10A shows Tafel plots and corresponding Tafel slope values for bare NF and NiPd based catalysts deposited over the NF at various deposition times, according to certain embodiments.

Tafel slope is an essential parameter in understanding the OER/HER kinetics of the water-splitting process. FIG. 10A indicates the Tafel plots of NiPd electrocatalysts derived by extrapolating the linear parts of their polarization curves. Expectedly, the NiPd@NF$_{120}$ electrode (1004) possesses the lowest Tafel slope of 58 mVdec$^{-1}$ than that of NiPd@NF$_{60}$ (1002), having a Tafel slope of 68 mVdec$^{-1}$, NiPd@NF$_{180}$ (1006) having a Tafel slope of 75 mVdec$^{-1}$, and bare NF (1008) having a Tafel slope of 135 mVdec$^{-1}$, and commercial IrO$_2$ (97.55 mVdec$^{-1}$) indicating the faster reaction rate of above during OER process. Under alkaline conditions, the water oxidation reaction is considered the following process.

$$C + OH^- \rightarrow C\text{—}OH_{ads} + e^-. \tag{Eq. 9}$$

$$C\text{—}OH_{ads} + OH^- \rightarrow C\text{—}O_{ads} + e^- + H_2O. \tag{Eq. 10}$$

$$C\text{—}O + OH^- \rightarrow C\text{—}OOH + e^-. \tag{Eq. 11}$$

$$C\text{—}OOH + OH^- \rightarrow C\text{—}OO^- + H_2O. \tag{Eq. 12}$$

$$C\text{—}OO^- \rightarrow C + O_2 + e^-. \tag{Eq. 13}$$

Figure 10B:
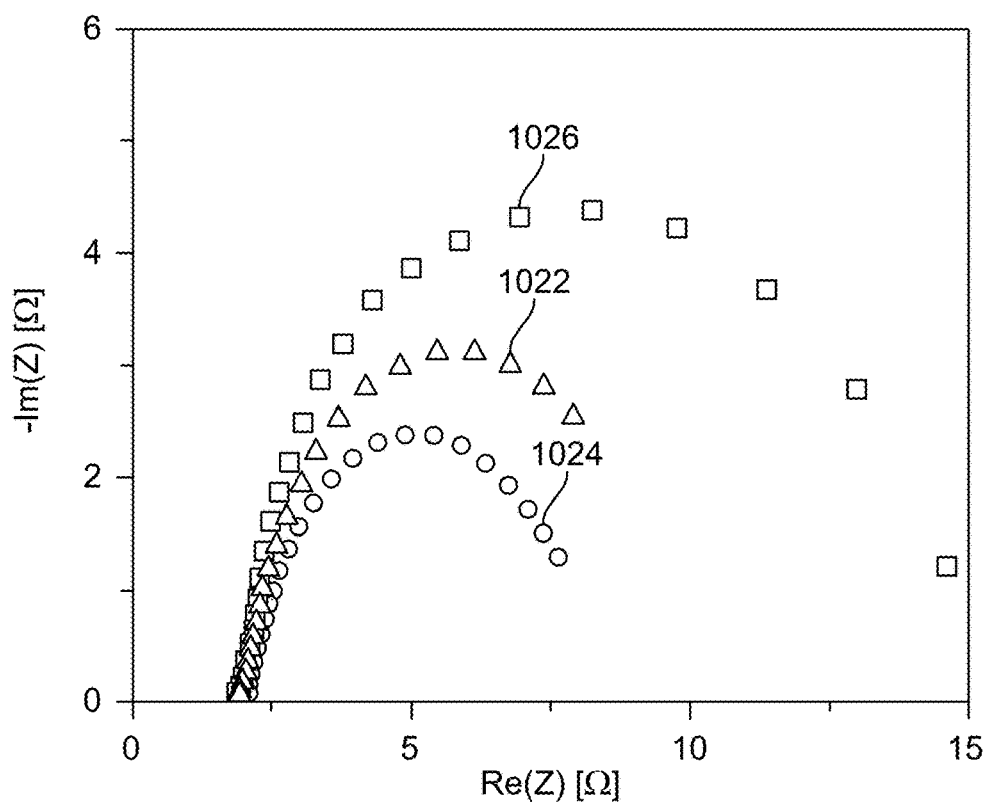
FIG. 10B shows Nyquist plots for NiPd/$NF_{60}$, NiPd/$NF_{120}$, NiPd/$NF_{180}$, according to certain embodiments.

Here, "C" can be regarded as an active catalytic site. Through the Tafel slope value, the rate-determining step of the water oxidation reaction can be directly predicted. Here, the Tafel slope of 58 mVdec$^{-1}$ indicates the 3$^{rd}$ step as the rate-determining step of water oxidation. The Tafel slopes of NiPd@NF$_{60}$ (1002) and NiPd@NF$_{180}$ (1006) are very close, suggesting similar reaction pathways and rate-determining steps in these electrodes in the same alkaline environment. Furthermore, EIS studies were performed to evaluate the intrinsic OER activity of the NiPd@NF electrocatalysts, and corresponding Nyquist plots are illustrated in FIG. 10B. The smaller EIS semicircle of NiPd@NF$_{120}$ (1024) indicates an excellent charge transfer process at the electrode surface in comparison to NiPd@NF$_{60}$ (1022) and NiPd@NF$_{180}$ (1026).

Figure 10C:
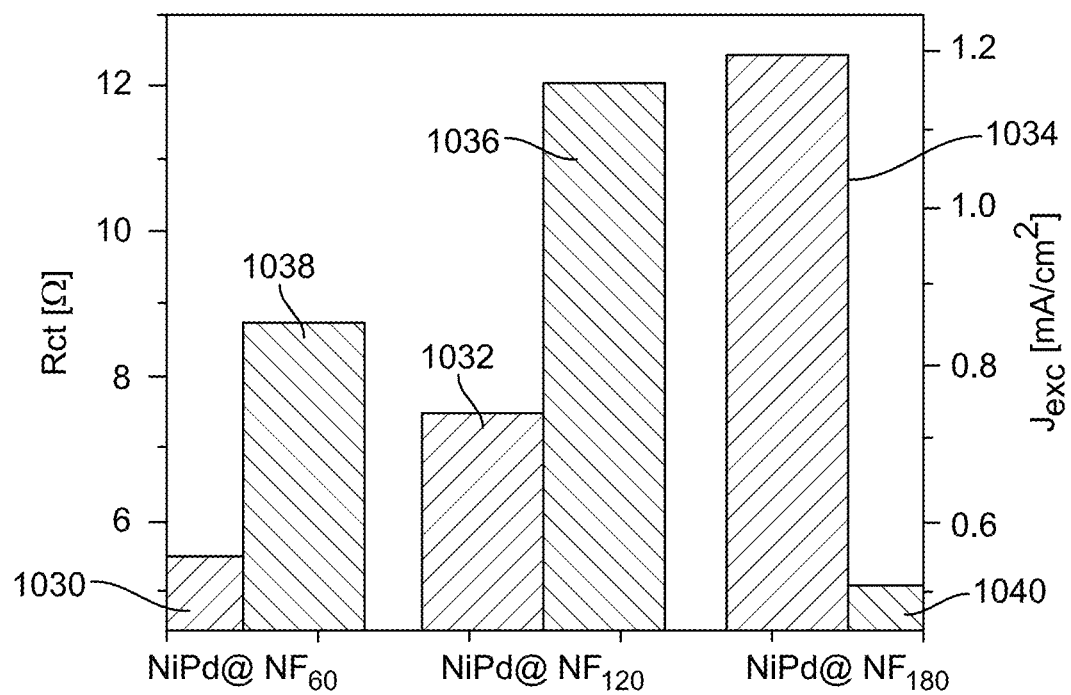
FIG. 10C is a bar graph showing charge transfer resistance and exchange current density values of the catalytic systems, according to certain embodiments.
Figure 11:
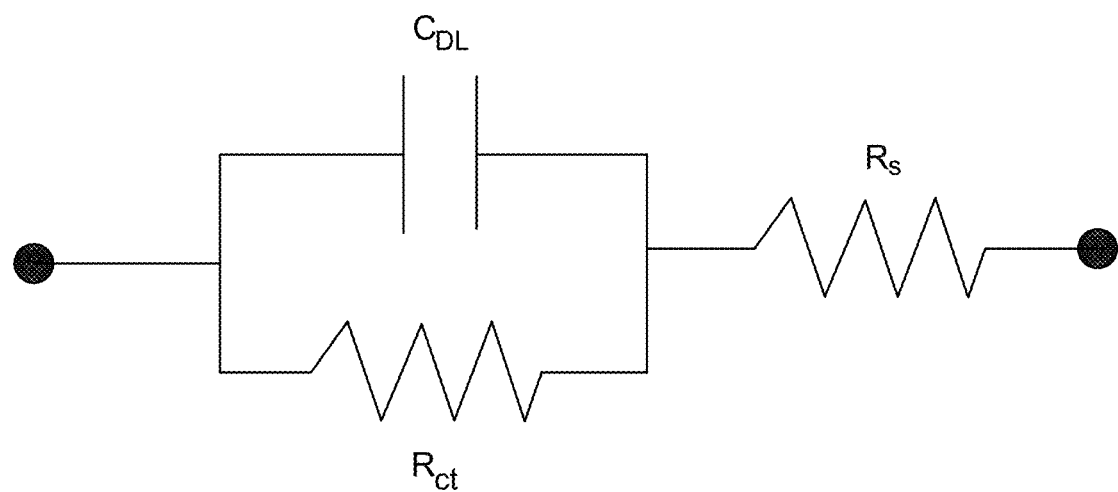
FIG. 11 depicts a simplified Randle's circuits are fitted to study charge transfer resistance values, according to certain embodiments.

Further, NiPd@NF$_{60}$ (1030) presents a small charge transfer resistance ($R_{ct}$) value of 5.5Ω whereas, NiPd@NF$_{120}$ (1032) and NiPd@NF$_{180}$ (1034) show a charge transfer resistance of 7.5Ω and 12.4Ω respectively FIG. 10C. A simplified Randle's circuits are fitted to study charge transfer resistance values and presented in FIG. 11. Exchange current density ($J_{exc}$) is another important electrochemical parameter evaluating the intrinsic activity of the electrocatalyst. The exchange current density of all electrocatalysts is calculated from $R_{ct}$ values, and the values are provided below:

NiPd@NF$_{60}$=8.314 J/K·mol×298 K/4×96485 C/mol× 7.5Ω×1 cm$^2$=0.85 mA/cm$^2$

NiPd@NF$_{120}$=8.314 J/K·mol×298 K/4×96485 C/mol×5.5Ω×1 cm$^2$=1.16 mA/cm$^2$

NiPd@NF$_{180}$=8.314 J/K·mol×298 K/4×96485 C/mol×12.4Ω×1 cm$^2$=0.51 mA/cm$^2$

As expected, NiPd@NF$_{120}$ (1036) shows a high $J_{exc}$ of 1.16 mA cm$^{-2}$, whereas the $J_{exc}$ of NiPd@NF$_{60}$ (1038) and NiPd@NF$_{180}$ (1040) are found to be 0.85 mA cm$^{-2}$ and 0.51 mA cm$^{-2}$ respectively (FIG. 10C).

Figure 10D:
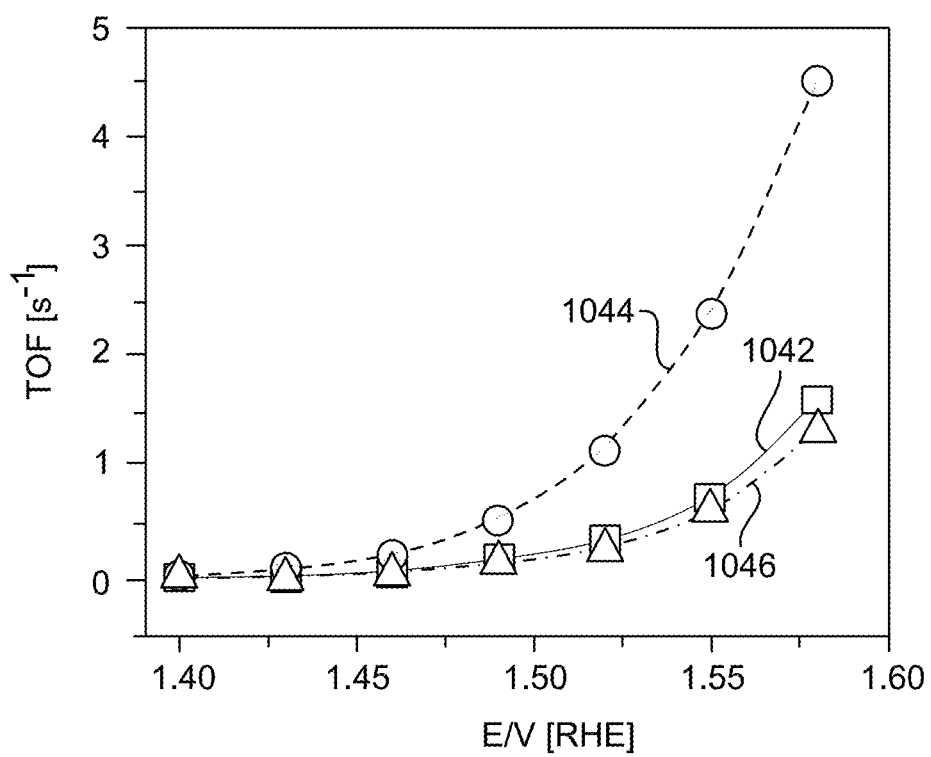
FIG. 10D shows turnover frequency (TOF) values of all catalytic systems recorded at various potentials directly from the polarization curves, according to certain embodiments.

The inherent catalytic activities of NiPd@NF catalysts for OER were further compared by estimating the turnover frequency (TOF). For TOF calculations, it is assumed that all Ni and Pd sites on the catalyst surface participate in OER. TOF is calculated using the following relation, $$TOF = \frac{j \times A}{4 \times F \times m},$$ (Eq. 14)

where j is the current density obtained at an overpotential of 350 mV in A cm$^{-2}$, A is the surface area of NF substrate (1 cm$^{-2}$), F is the Faraday constant (96,485 C mol$^{-1}$). M is the number of moles of the catalyst deposited onto NF substrate. The mass of NiPd catalysts deposited by the AACVD was found to be 0.12, 0.28 and 0.45 mg for NiPd@NF$_{60}$ (1042), NiPd@NF$_{120}$ (1044), and NiPd@NF$_{180}$ (1046) respectively. The TOF values of NiPd nano-alloy catalysts deposited on the NF for different time intervals were calculated at various overpotentials directly recorded from polarization curves and are illustrated in FIG. 10D. The TOF values determined at 350 mV are found to be 1.60 s$^{-1}$, 4.49 s$^{-1}$, and 1.33 s$^{-1}$ for NiPd@NF$_{60}$ (1042), NiPd@NF$_{120}$ (1044), and NiPd@NF$_{180}$ (1046) respectively. The higher TOF value of the NiPd@NF$_{120}$ electrode makes it distinguished from the other NiPd nano-alloy-based electrocatalysts to perform OER with improved kinetics. The determination of TOF for NiPd@NF$_{120}$ was as follows:

TOF@1.40V=[(0.0053 A)×(1 cm$^2$)]/[(4)×(7.27× 10$^{-7}$mol)×(96485 C mol1−)]=0.018 s$^{-1}$ TOF@1.43V=[(0.026 A)×(1 cm$^2$)]/[(4)×(7.27× 10$^{-7}$mol)×(96485 C mol1−)]=0.092 s$^{-1}$ TOF@1.46V=[(0.056 A)×(1 cm$^2$)]/[(4)×(7.27× 10$^{-7}$mol)×(96485 C mol1−)]=0.199 s$^{-1}$ TOF@1.49V=[(0.148 A)×(1 cm$^2$)]/[(4)×(7.27× 10$^{-7}$mol)×(96485 C mol1−)]=0.527 s$^{-1}$ TOF@1.52V=[(0.325 A)×(1 cm$^2$)]/[(4)×(7.27×10$^{-7}$ mol)×(96485 C mol1−)]=1.158 s$^{-1}$ TOF@1.55V=[(0.67 A)×(1 cm$^2$)]/[(4)×(7.27× 10$^{-7}$mol)×(96485 C mol1−)]=2.38 s$^{-1}$ TOF@1.58V=[(1.26 A)×(1 cm$^2$)]/[(4)×(7.27× 10$^{-7}$mol)×(96485 C mol1−)]=4.49 s$^{-1}$ The TOF calculations from OER polarization curves at various applied potentials for all catalysts are shown in Table 1.

TABLE 1

| TOF (s$^{-1}$) | NiPd@NF$_{60}$ | NiPd@NF$_{120}$ | NiPd@NF$_{180}$ |
| --- | --- | --- | --- |
| TOF@1.40 | 0.007 | 0.018 | 0.007 |
| TOF@1.43 | 0.025 | 0.092 | 0.025 |
| TOF@1.46 | 0.046 | 0.19 | 0.042 |
| TOF@1.49 | 0.171 | 0.527 | 0.13 |
| TOF@1.52 | 0.33 | 1.15 | 0.26 |
| TOF@1.55 | 0.7 | 2.38 | 0.6 |
| TOF@1.58 | 1.6 | 4.49 | 1.33 |

Figure 10E:
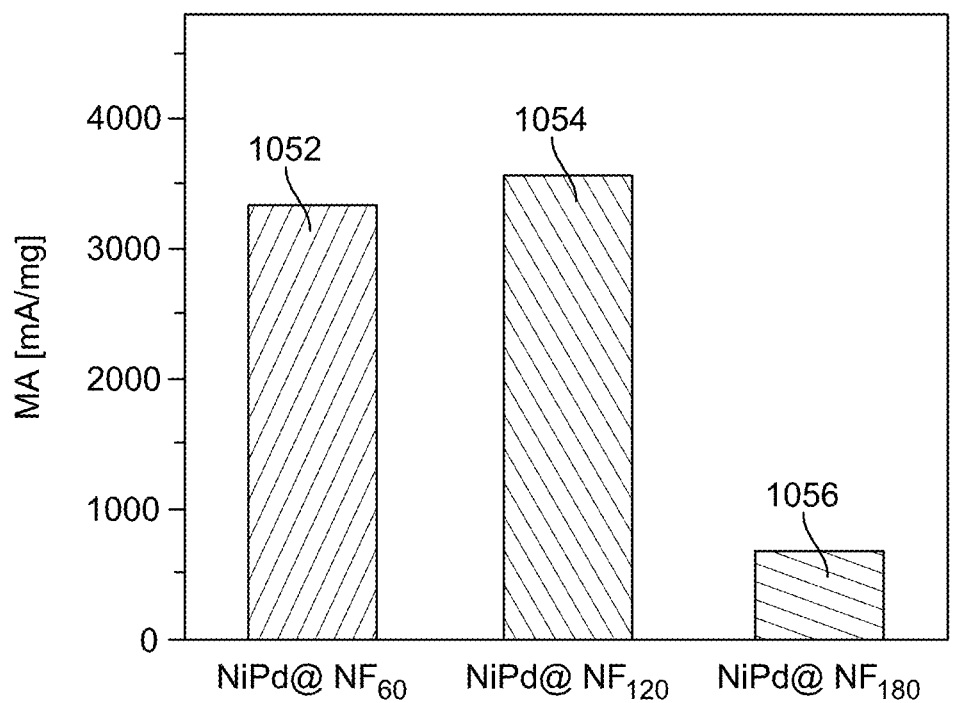
FIG. 10E shows mass activity values for the Ni—Pd based catalytic systems, according to certain embodiments.

Furthermore, NiPd@NF$_{120}$ (1054) presented a high mass activity of 3571 mA mg' relative to NiPd@NF$_{60}$ (1052) and NiPd@NF$_{180}$ (1056), which shows mass activity values of 3333 mA mg-land 693 mA mg' calculated at 350 mV (FIG. 10E). The mass activity for each of these samples was calculated as follows:

NiPd@NF$_{60}$=400 mA/0.12 mg=3333 mA/mg

NiPd@NF$_{120}$=1000 mA/0.28 mg=3571 mA/mg

NiPd@NF$_{180}$=312 mA/0.45 mg=693 mA/mg

The estimation of ECSA is fundamental to evaluating the performance of the electrocatalyst since the current measured with sweeping potential is directly proportional to the area of the electrode exposed to the electrolyte. The double-layer capacitance ($C_{DL}$) was determined for different electrodes by cycling the electrode in the non-Faradaic regions at different scan rates (v) from 10 mV/s to 60 mV/s. The current density (j) increased linearly with the scan rate. The electrical double-layer capacitance was determined by averaging the cathodic and anodic slopes of the plots of current versus scan rate, as shown in FIGS. 12-14.

Figure 12A:
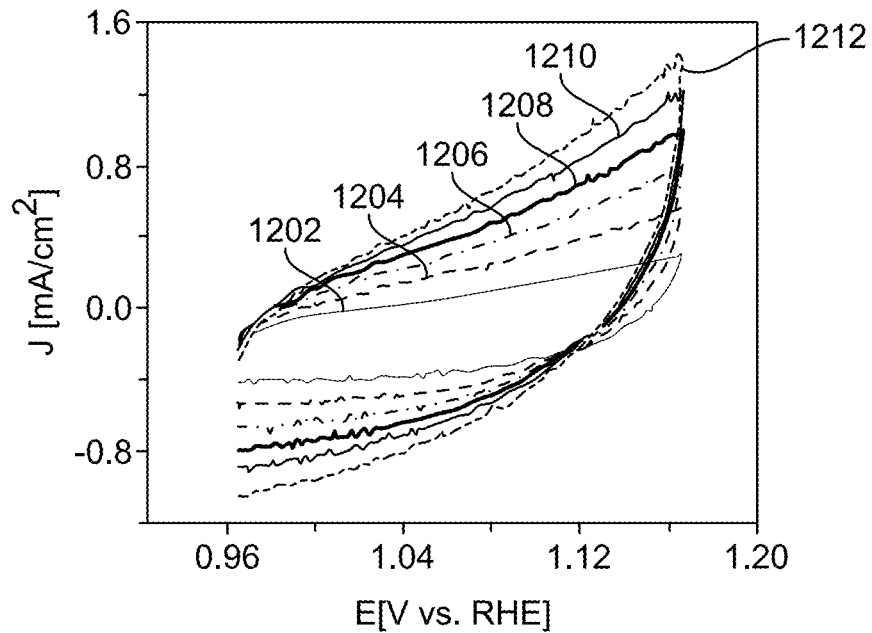
FIG. 12A depicts a CV measured at various scan rates from 10 mV/s to 60 mV/s for NiPd@$NF_{60}$ in the non-faradaic regions of the polarization curve, according to certain embodiments.
Figure 12B:
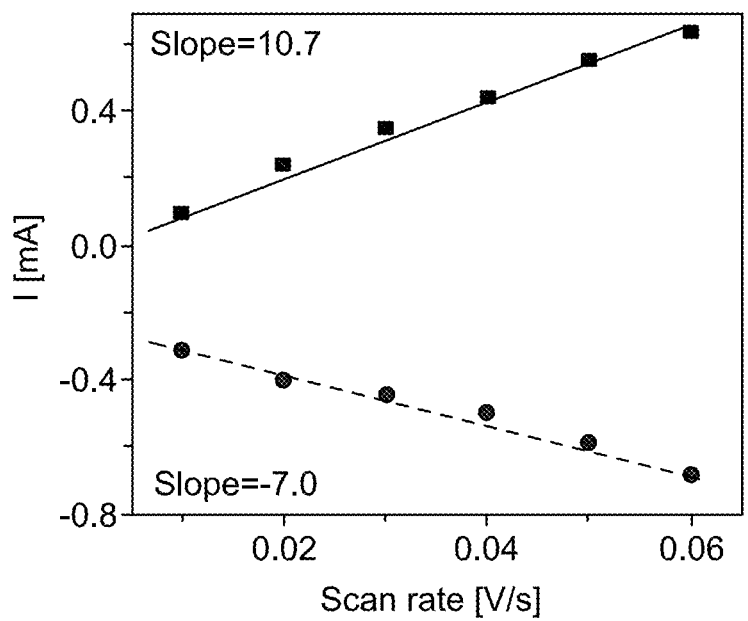
FIG. 12B shows charging current measured at the fixed potential of 1.17 V (vs. RHE) ultimately plotted as a function of scan rate, according to certain embodiments.

Double-layer capacitance measurements for determining the ECSA of NiPd@NF$_{60}$ type electrocatalyst in 1.0 M KOH electrolyte solution is shown in FIG. 12. FIG. 12. A depicts a CV measured at various scan rates such as from 10 mV s$^{-1}$ (1202), 20 mV s$^{-1}$ (1204), 30 mV s$^{-1}$ (1206), 40 mV s$^{-1}$ (1208), 50 mV s$^{-1}$ (1210), and 60 mV s$^{-1}$ (1212) in the non-faradaic regions of polarization curve, where all obtained current is supposed to be due to capacitive charging only; FIG. 12B depicts charging current measured at the fixed potential of 1.07 V (vs. RHE) ultimately plotted as a function of scan rate where slope giving the value of double-layer capacitance such as 8.85 mF and ECSA is found to be 221.2 cm$^2$ (the geometrical area of the working electrode is 1 cm$^2$).

Figure 13A:
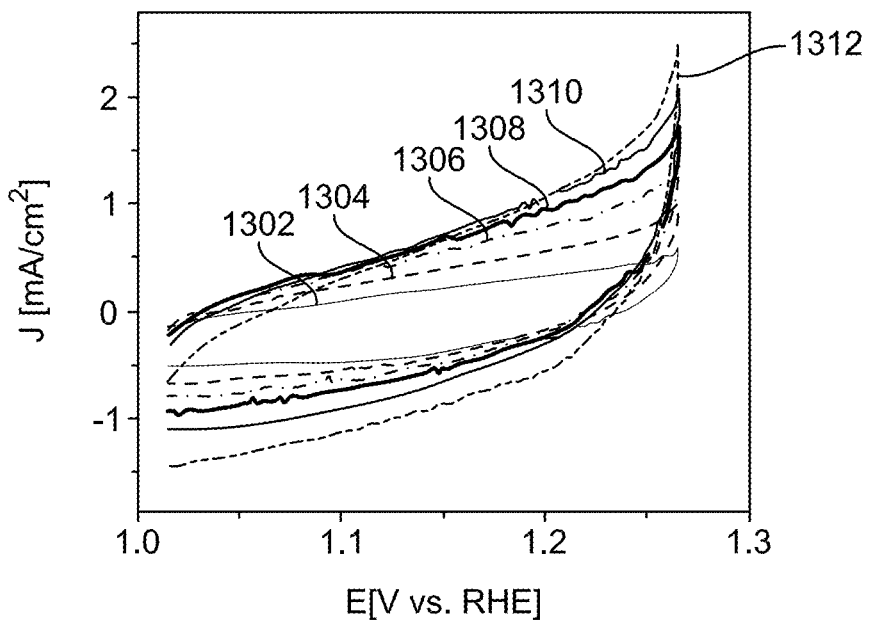
FIG. 13A depicts a CV measured at various scan rates from 10 mV/s to 60 mV/s for NiPd@$NF_{120}$, in the non-faradaic regions of the polarization curve, according to certain embodiments.
Figure 13B:
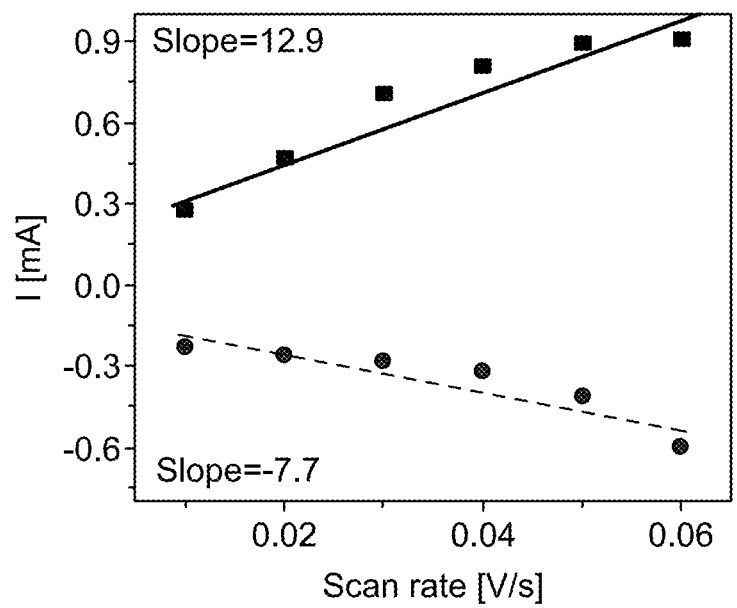
FIG. 13B shows charging current measured at the fixed potential of 1.18 V (vs. RHE) ultimately plotted as a function of scan rate, according to certain embodiments.

Double-layer capacitance measurements for determining the ECSA of NiPd@NF$_{120}$ type electrocatalyst in 1.0 M KOH electrolyte solution are shown in FIG. 13. FIG. 13A depicts a CV measured at various scan rates such as from 10 mV s$^{-1}$ (1302), 20 mV s$^{-1}$ (1304), 30 mV s$^{-1}$ (1306), 40 mV s$^{-1}$ (1308), 50 mV s$^{-1}$ (1310), and 60 mV s$^{-1}$ (1312) in the non-faradaic regions of polarization curve, where all obtained current is supposed to be due to capacitive charging only;

FIG. 13B depicts charging current measured at the fixed potential of 1.18 V (vs. RHE) ultimately plotted as a function of scan rate where slope giving the value of double-layer capacitance such as 10.3 mF and ECSA is found to be 257.5 cm$^2$ (the geometrical area of the working electrode is 1 cm$^2$).

Figure 14A:
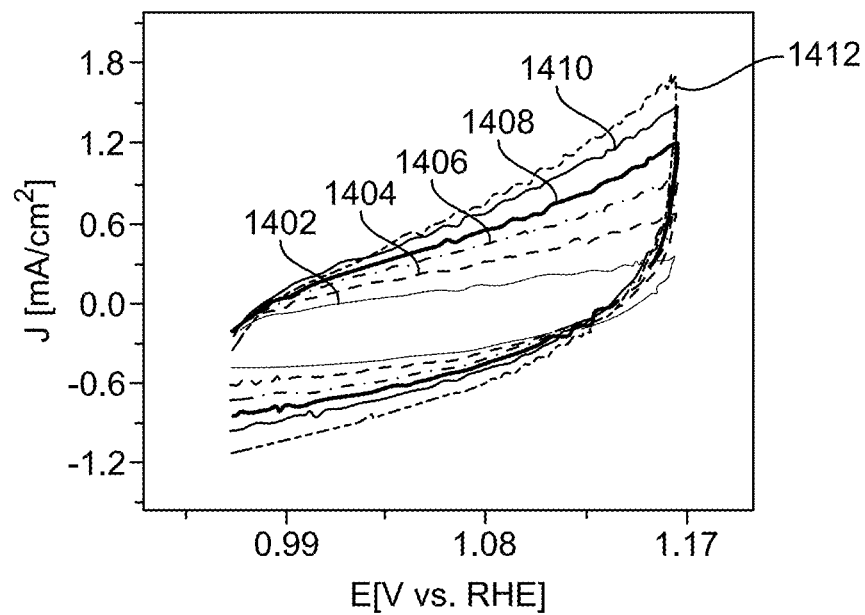
FIG. 14A depicts a CV measured at various scan rates from 10 mV/s to 60 mV/s for NiPd@$NF_{180}$ in the non-faradaic regions of the polarization curve, where all obtained current is supposed to be due to capacitive charging only, according to certain embodiments.
Figure 14B:
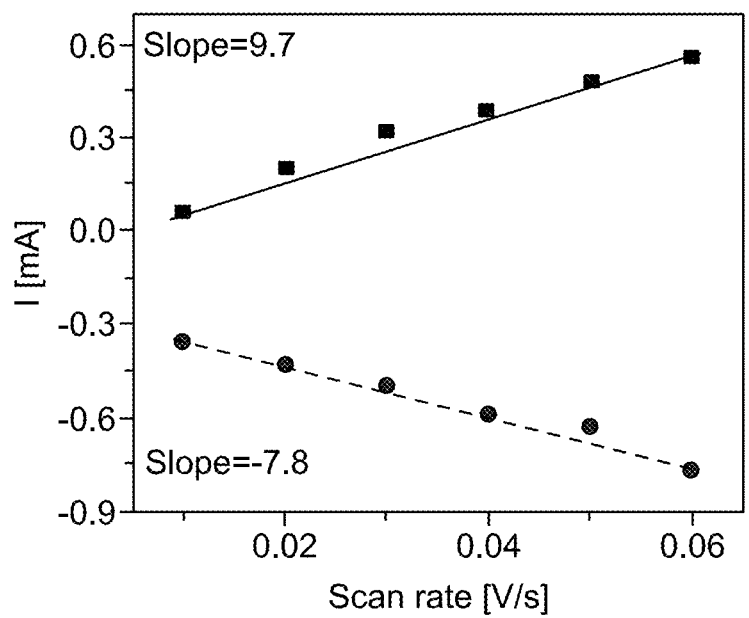
FIG. 14B shows charging current measured at the fixed potential of 1.05 V (vs. RHE) ultimately plotted as a function of scan rate, according to certain embodiments.

Similarly, the double-layer capacitance measurements for determining the ECSA of NiPd@NF$_{180}$ type electrocatalyst in 1.0 M KOH electrolyte solution are shown in FIG. 14. FIG. 14A depicts a CV of NiPd nano-alloy as a new benchmark low overpotential electrocatalyst for efficient oxygen evolution reaction measured at various scan rates such as from 10 mV s$^{-1}$ (1402), 20 mV s$^{-1}$ (1404), 30 mV s$^{-1}$ (1406), 40 mV s$^{-1}$ (1408), 50 mV s$^{-1}$ (1410), and 60 mV s$^{-1}$ (1412) in the non-faradaic regions of polarization curve, where all obtained current is supposed to be due to capacitive charging only; FIG. 14B depicts charging current measured at the fixed potential of 1.05 V (vs. RHE) ultimately plotted as a function of scan rate where slope giving the value of double-layer capacitance such as 8.75 mF and ECSA is found to be 218.7 cm$^2$ (the geometrical area of the working electrode is 1 cm$^2$).

Figure 10F:
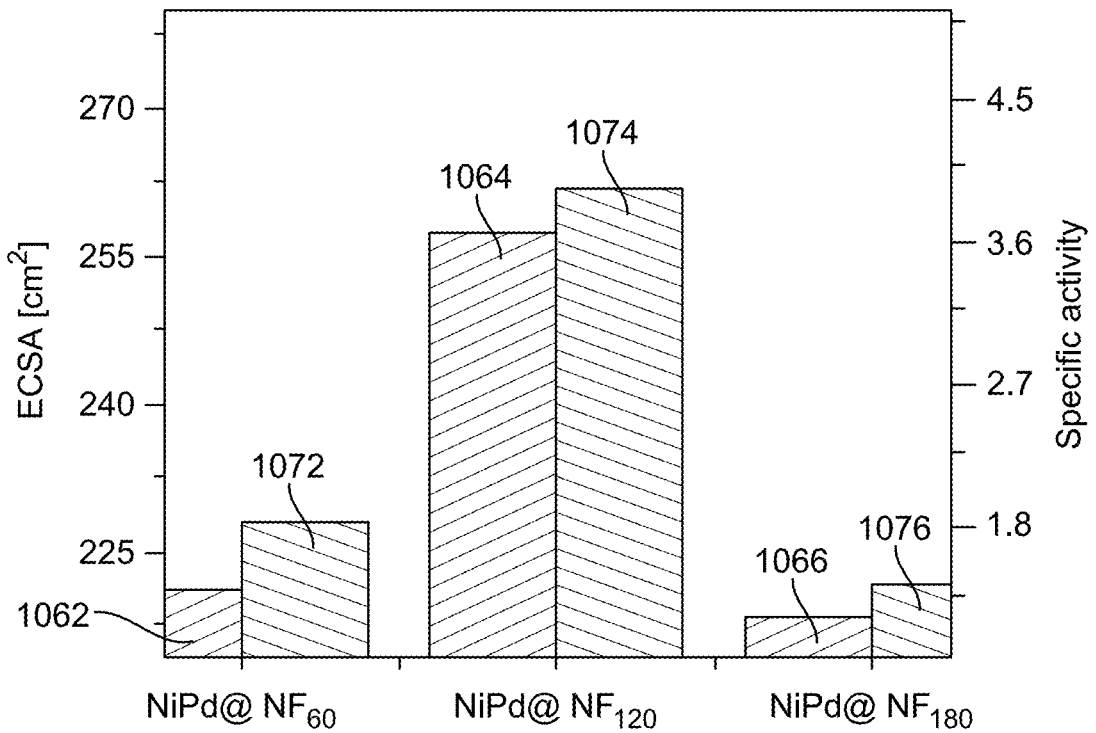
FIG. 10F shows the electrochemical surface area (ECSA) and specific activity of NiPd/NF based catalytic systems, according to certain embodiments.

The double-layer capacitance and calculated ECSA values of NiPd@NF$_{60}$ (1062), NiPd@NF$_{120}$ (1064), and NiPd@NF$_{180}$ (1066) are (listed in Tables 2A and 2B). NiPd@NF$_{120}$ showed a higher ECSA of 257 cm$^2$ than the other two electrodes (FIG. 10F). Likewise, inherent catalytic activity is studied by calculating specific activities of the catalysts NiPd@NF$_{60}$ (1072), NiPd@NF$_{120}$ (1074), and NiPd@NF$_{180}$ (1076) from roughness factor at 350 mV, as shown below:

Roughness Factor

NiPd@NF$_{60}$=221.2 cm$^2$/1 cm$^2$=221.2

NiPd@NF$_{120}$=257.5 cm$^2$/1 cm$^2$=257.5

NiPd@NF$_{180}$=218.7 cm$^2$/1 cm$^2$=218.7

Specific Activity

NiPd@NF$_{60}$=400mA/221.2=1.80mA/cm$^2$

NiPd@NF$_{120}$=1000 mA/257.5=3.88 mA/cm$^2$

NiPd@NF$_{180}$=312 mA/218.7=1.42 mA/cm$^2$

NiPd@NF$_{60}$ (1072), NiPd@NF$_{120}$ (1074), and NiPd@NF$_{180}$ (1076) illustrated specific activities of 1.80 mA cm$^{-2}$, 3.88 mA cm$^{-2}$, and 1.42 mA cm$^{-2}$ (FIG. 10F). Moreover, feasible kinetics of the electrochemical process over electrode surface is of great significance. The faster charge transfer process at the electrode surface makes it diffusion-controlled and kinetically fast.

TABLE 2A

OER parameters evaluating the performance of each NiPd@NF electrode investigated under similar electrochemical circumstances.

| Catalyst | Tafel slope (mV/dec) | $R_{ct}$ ($\Omega$) | $J_{exc}$ (mA/cm$^2$) | $C_{dl}$ (mF) |
|---|---|---|---|---|
| NiPd@NF$_{60}$ | 68 | 5.5 | 0.85 | 8.85 |
| NiPd@NF$_{120}$ | 58 | 7.5 | 1.16 | 10.3 |
| NiPd@NF$_{180}$ | 75 | 12.4 | 0.51 | 8.75 |

TABLE 2B

OER parameters evaluating the performance of each NiPd@NF electrode investigated under the similar electrochemical circumstance.

| Catalyst | ECSA (cm$^2$) | MA (mA/mg) @350 mV | TOF (s$^{-1}$) @ overpotential 350 mV | $J_s$ (mA cm$^{-2}$) |
|---|---|---|---|---|
| NiPd@NF$_{60}$ | 221.2 | 3333 | 1.6 | 1.8 |
| NiPd@NF$_{120}$ | 257.5 | 3571 | 4.49 | 3.88 |
| NiPd@NF$_{180}$ | 218.7 | 693 | 1.33 | 1.42 |

Figure 15A:
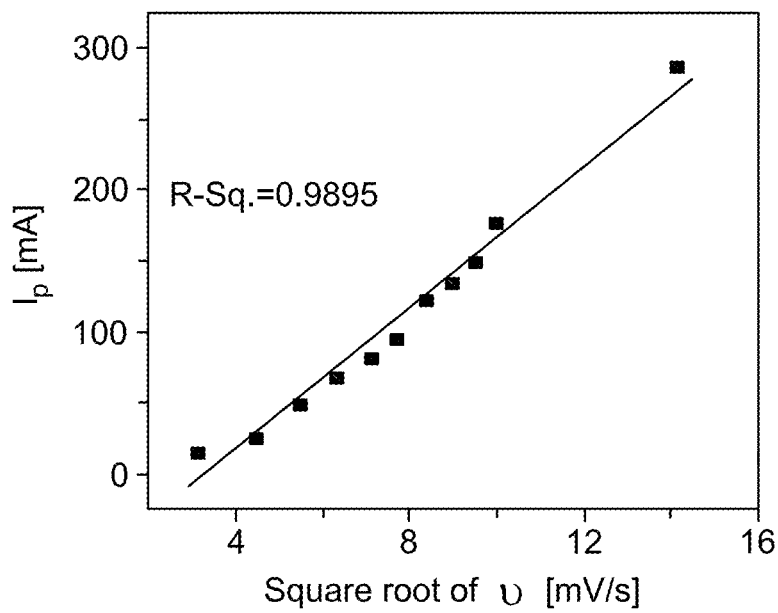
FIG. 15A shows peak current density of oxidation peak plotted against the square root of scan rate for NiPd@$NF_{120}$, according to certain embodiments.
Figure 15B:
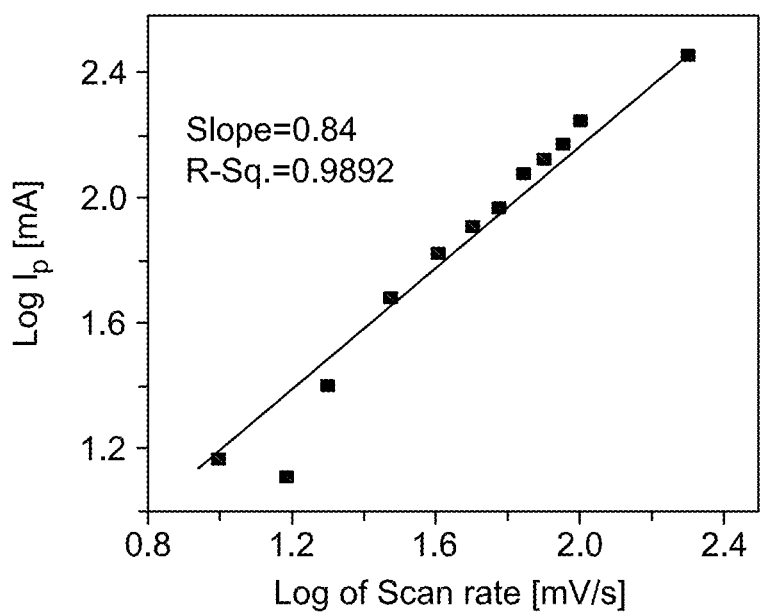
FIG. 15B shows a log of peak current density plotted against the log of scan rate for NiPd@$NF_{120}$, according to certain embodiments.

This may also be associated with large electroactive sites over the electrode surfaces. An increase in scan rate on the pre-oxidation peak current value (presenting metal oxidation process) of the best-performing catalyst such as NiPd@NF$_{120}$ was studied, and the results of this study are shown in FIGS. 15A and 15B. The plot of the square root of scan rate versus pre-oxidation peak current was almost linear (R$^2$=0.9895), demonstrating the system under study is diffusion controlled. Furthermore, the log of scan rate versus the log of pre-oxidation peak current was also linear (R$^2$=0.9892) having a slope of slope=0.8 which is nearer to the theoretical value of a diffusion-controlled reaction. The results illustrate that NiPd@NF$_{120}$ catalyst has optimum electroactive sites over their nano-surfaces that drive the OER process at low overpotentials and demonstrate feasible reaction kinetics under employed electrochemical conditions. Further, the long-term durability of electrodes for large-scale applications was evaluated. For this purpose, a chronopotentiometry test was conducted to observe the electrocatalytic stability of the NiPd@NF$_{120}$ electrode.

Figure 15C:
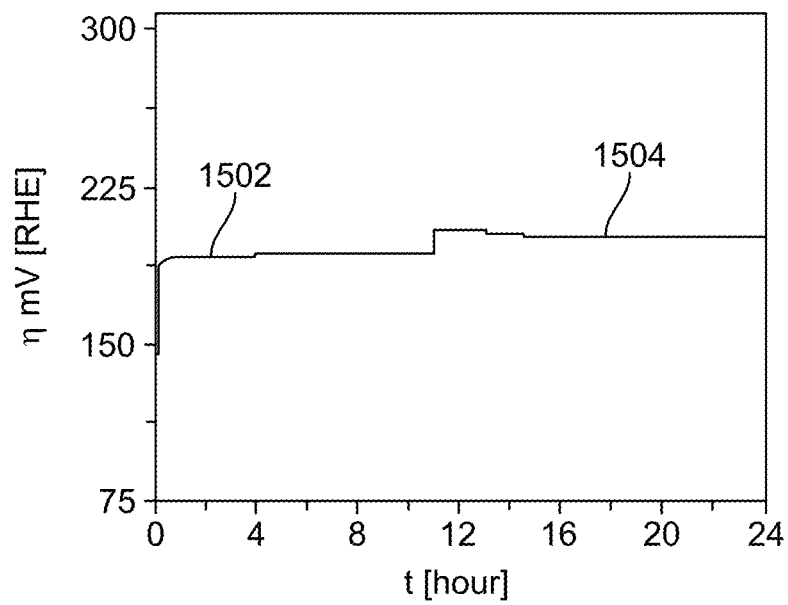
FIG. 15C shows chronopotentiometry response (η vs. t) of NiPd@$NF_{120}$ catalyst at two different applied current densities of 10 and 20 mA $cm^{-2}$ in 1.0 M KOH electrolyte solution for NiPd@$NF_{120}$, according to certain embodiments.

The catalyst was operated at two different current densities of 10 and 20 mA cm$^{-2}$ for 24 hours, and the resultant time versus overpotential plot is shown in FIG. 15C. The straight-line overpotential response against two applied current densities confirmed the prolonged stability of NiPd@NF$_{120}$ during OER catalysis. The $\eta_{10}$ value at 10 mA cm$^{-2}$ (1502) was 190 mV until the first 11 h. Shifting the current density from 10 to 20 mA cm$^{-2}$ (1504) resulted in an increment in overpotential value from 190 to 205 mV. The $\eta_{20}$ value at 20 mA cm$^{-2}$ improved after 1 h 45 min to 201 mV and remained almost constant to this value for the next 13 h. This shows in-situ activation of catalyst and generation of more and more electroactive sites over catalyst surface during long-term OER testing under alkaline conditions. The result also indicates that overpotential values at two different applied current densities almost remain constant, and no drop or decline in activity is observed. Likewise, any sign of deterioration or detachment of the film electrode was not detected during the long-term stability test. One of the most significant advantages of thin film electrocatalyst over powder electrocatalyst is that the catalyst does not detach during the electrochemical study.

Figure 15D:
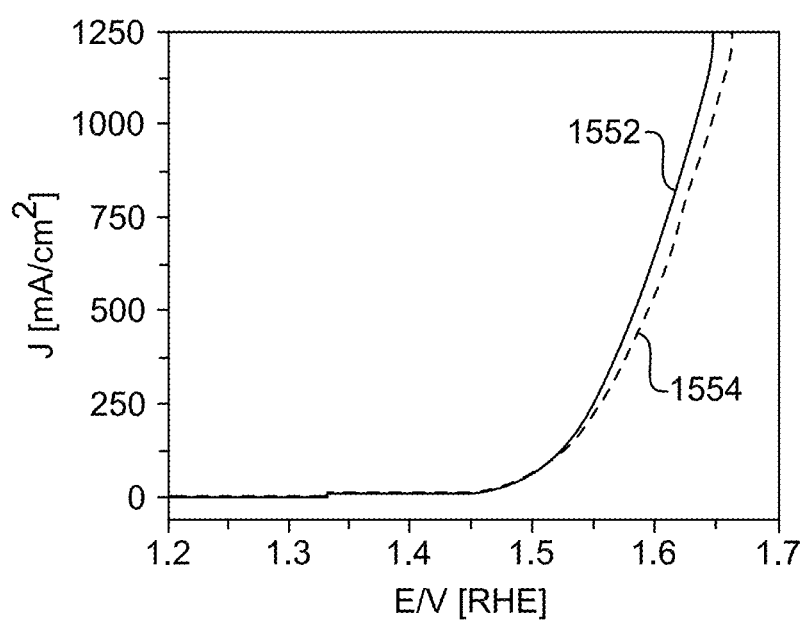
FIG. 15D shows polarization curves of NiPd@$NF_{120}$ catalyst before and after carbon-ceramic electrode (CCE) experiment, according to certain embodiments.

After the stability test, the polarization curve of the NiPd@NF$_{120}$ electrode was immediately obtained and compared with its response before the stability test (1552), as shown in FIG. 15D. After the stability test (1554), the polarization curve showed consistent behavior at lower potentials but slightly changed at higher potentials. The slight change at higher potential could be attributed to the restructuring that occurred in the catalyst surface after performing a long-term OER operation. Such a trend is observed in many reported OER/HER electrocatalysts.

Figure 16A:
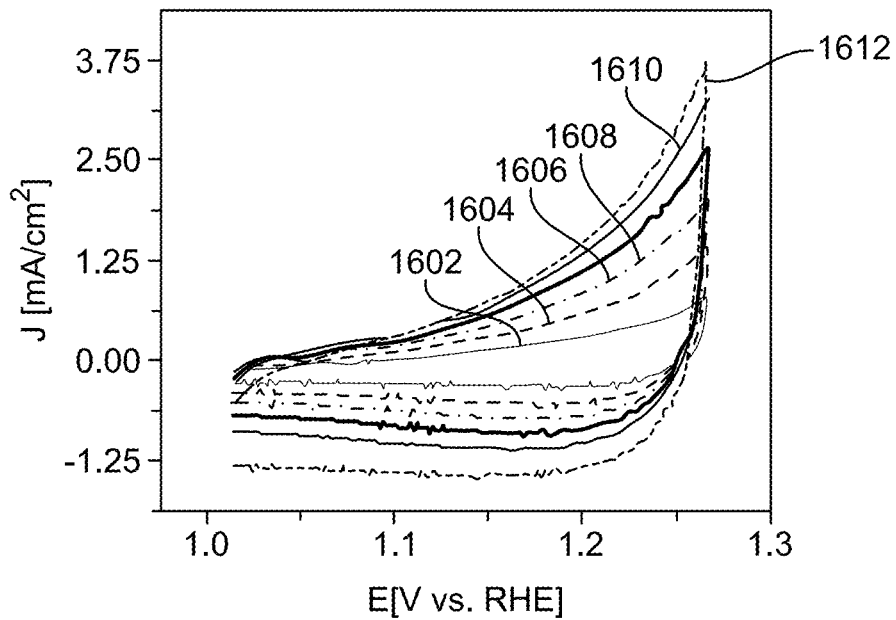
FIG. 16A shows CV collected at various scan rates considering the non-faradaic region of the polarization curve for NiPd/$NF_{120}$, according to certain embodiments.
Figure 16B:
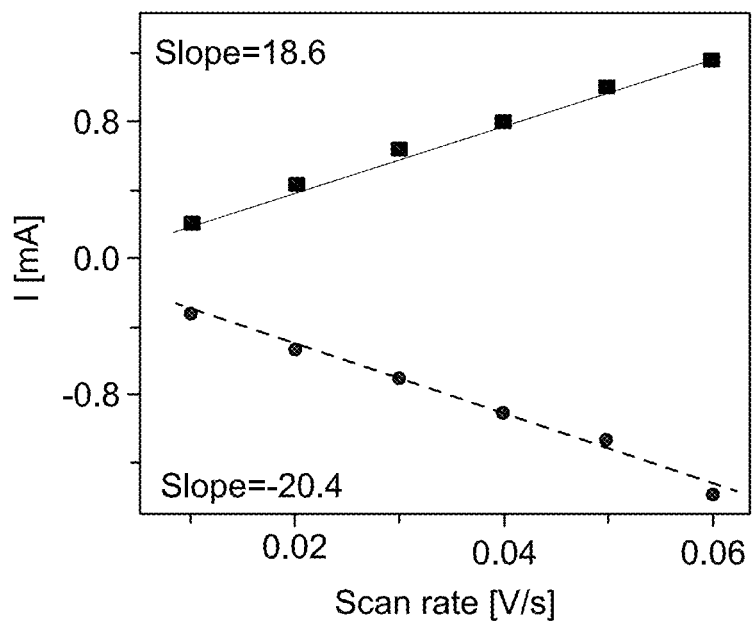
FIG. 16B shows the cathodic and anodic charging current measured at 1.17 V vs. RHE plotted as a function of scan rate for double-layer capacitance measurement, according to certain embodiments.

Post-CCE catalytic characterizations were performed to study surface modifications and structural alteration in NiPd@NF$_{120}$ based catalyst. FIG. 16A depicts a CV measured at various scan rates such as from 10 mV s$^{-1}$ (1602), 20 mV s$^{-1}$ (1604), 30 mV s$^{-1}$ (1606), 40 mV s$^{-1}$ (1608), 50 mV s$^{-1}$ (1610), and 60 mV s$^{-1}$ (1612) in the non-faradaic regions of polarization curve, where all obtained current is supposed to be due to capacitive charging only; FIG. 12B depicts cathodic and anodic charging current measured at 1.17 V vs. RHE plotted as a function of scan rate for double-layer capacitance measurement. ECSA was calculated following the similar protocol as mentioned above, and the catalyst presented a much-enhanced ECSA of 487.5 cm$^2$ which shows in-situ generation and activation of more active catalytic sites over the catalyst surface during the oxidation process (FIGS. 16A and 16B).

Figures 16C, 16D:
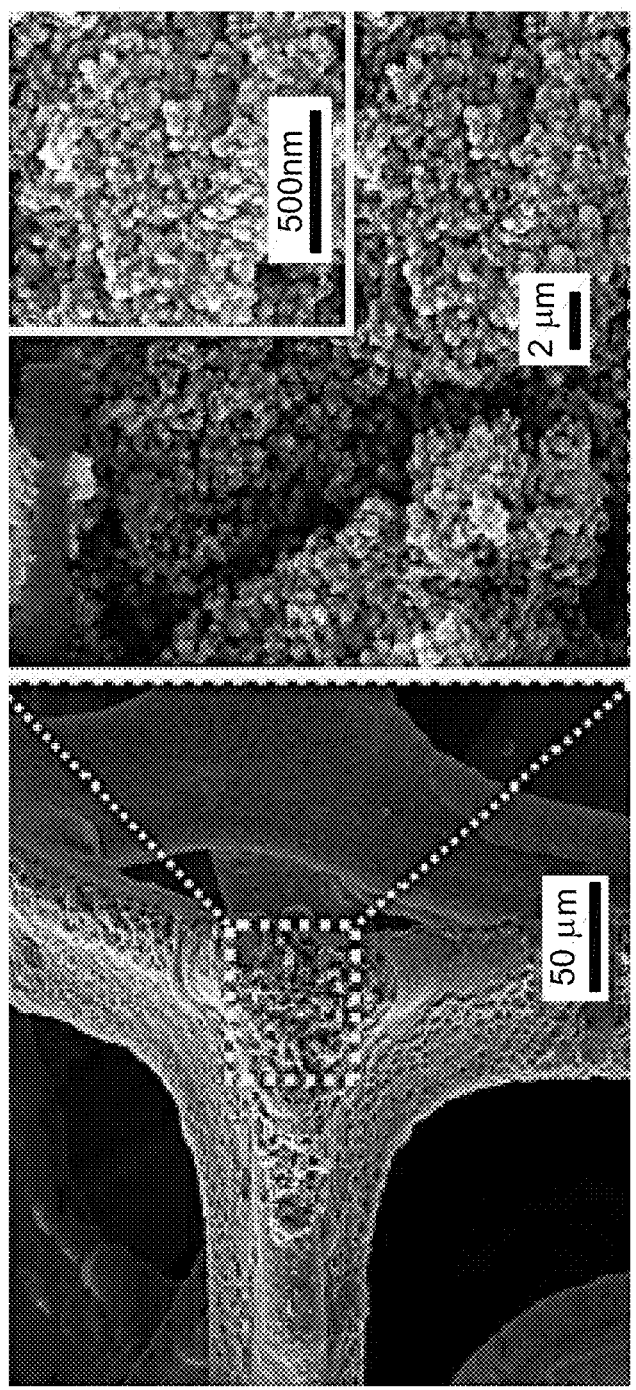
FIG. 16C and FIG. 16D show scanning electron microscope (SEM) images of NiPd/$NF_{120}$ after CCE, according to certain embodiments.
Figure 16F:
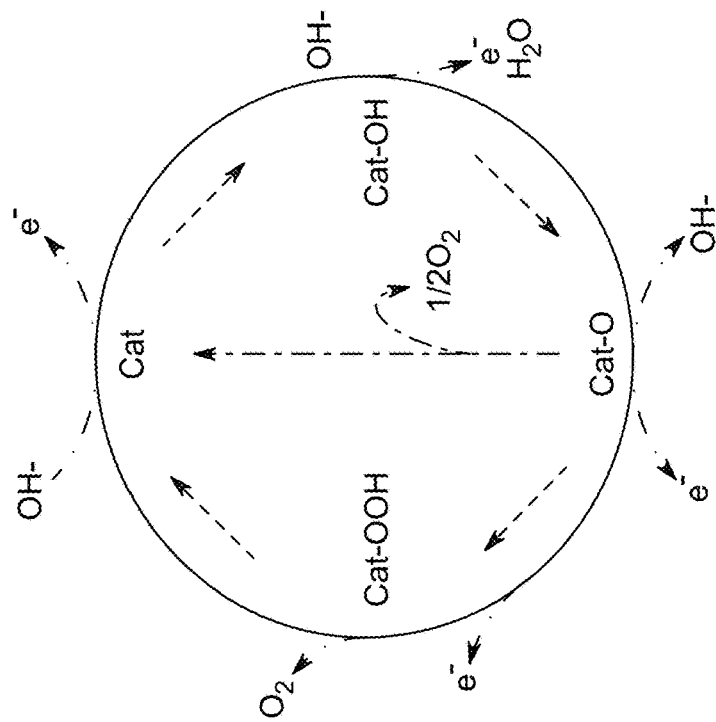
FIG. 16F shows (reaction mechanism over catalyst surface in alkaline conditions, according to certain embodiments.
Figure 16E:
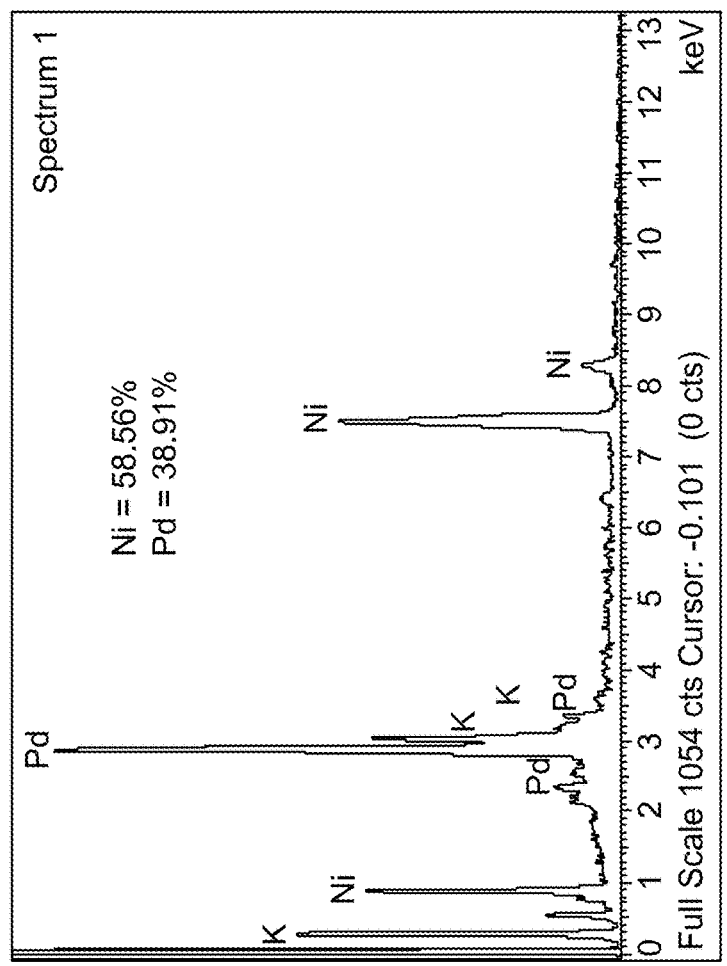
FIG. 16E shows EDX spectra of NiPd/NF$_{120}$ after CCE, according to certain embodiments.

This behavior is consistent with lowering the overpotential value from 248 to 241 mV to achieve a fixed current density of 20 mA cm$^{-2}$ during the CCE experiment (FIG. 15C). Furthermore, the retained nanoparticulate type morphology even after a prolonged period of harsh oxidation process illustrates the mechanical stability of our facilely designed catalytic module (FIGS. 16C and 16D). EDX spectral analysis shows no obvious peak for oxygen on the catalyst surface (FIG. 16E) and denotes the sustainability of NiPd nano-alloy for water oxidation catalysis (FIG. 16F)·s The OER characteristics of the best performing NiPd@NF$_{120}$ catalyst were compared with other Ni-based, and noble metal benchmark (Ru and Ir oxides) electrocatalysts reported previously and are shown in Table 2. The remarkable water oxidation performance of NiPd@NF$_{120}$ catalyst, notably significantly lower onset overpotential, and η at 10 mA cm$^2$ was found to be highly superior compared to many recently published single, binary, and ternary metal-based catalysts in comparison to those listed in Table 2 and synthesized by different chemical methods. The high activity can be attributed to the unique nanoscale alloy of NiPd thin film catalyst. Pd is considered an active OER catalyst due to its intrinsic catalytic activity. It is generally believed that metal-H$_2$O interactions are the main factor in kinetically facilitating the splitting of the water molecule into molecular oxygen and hydrogen. Pd alloy with Ni further favors the strong affinity of catalytic sites for the water molecules, resulting in faster kinetics and balanced binding energy states with reaction intermediates, thus making the adsorption/desorption process efficient at the intermetallic surface. As Ni has a smaller lattice constant than Pd, alloying of Ni with Pd causes a shortening of Pd—Pd bond distance, ultimately weakening the bond, and correspondingly, the catalytic activity of Pd in NiPd nano-alloy was enhanced.

Furthermore, in NiPd alloy, intrinsically electroactive Ni sites further improve the catalytic performance by synergistic effect. Underlying porous, conductive, high surface area catalyst support favors fast electronic communications between electrode/electrocatalysts. Thus, these cumulative effects cause electronic modulation of the overall catalyst structure, changing the newly formed alloy's binding energy, enhancing reaction rate, catalyst durability, selectivity, and intrinsic stability. The facile synthesis strategy associated with short electrode fabrication time is crucial for the catalyst's scalability. Thus, NiPd electrode obtained in two-hour deposition via single-step AACVD employing simpler precursors is much more promising than those achieved after long and tedious synthetic routes where synthesis and performance reproducibility might be challenging.

TABLE 3

Indicates the assessment of OER parameters of Pd and Ni-based electrocatalysts synthesized from different fabrication methods.

| Catalysts | Synthesis route | Synthesis period | Overpotential (mV) @10 mA cm$^{-2}$ | Tafel Slope (mV dec$^{-1}$) |
|---|---|---|---|---|
| NiFe$_2$O$_4$/VACNT* | Multistep processes | ~20 h | 240 | 70 |
| NP-NiCo$_2$O$_4$@NF* | Hydrothermal | ~18 h | 360 | 150 |
| NiCo alloy@NF* | Hydrothermal followed by reduction under H$_2$ | ~10 h | 320 | 69.4 |
| NiMoCo alloy@NF* | Hydrothermal followed by reduction under H$_2$ | ~12 h | 277 | 87 |
| NiIrRuAl alloy* | Multi-technique process | NA | 237 | 50 |
| PdNi/CNF* | Electrospinning and thermal treatment | 15 h | 289 mV | 117 |
| FeNi$_3$ on N-doped hollow carbon rod* | Multi-processes | 24 h | 340 mV | 86.67 |
| IrO$_2$* | Commercially available | NA | 301 | 97.3 |
| RuO$_2$* | Commercially available | NA | 360 | 68.1 |
| NiPd@NF$_{120}$ catalyst of the present disclosure | Single-step AACVD | 24 h | 220 | 58 |

*Indicates catalysts used in literature.

The fabrication of NiPd nano-alloy thin film on nickel foam (NF) substrate via aerosol-assisted chemical deposition has been successfully demonstrated. The synthesized NiPd catalysts attain a hierarchical nanoparticle structure with uniform elemental distribution over the porous NF surface to provide a large catalytically active surface area. The electrocatalytic activity, stability, and kinetics were extensively evaluated. The electrochemical investigation indicates that NiPd@NF demonstrates efficient OER activities, even better than IrO$_2$ catalysts in alkaline electrolytes. Notably, the NiPd@NF$_{120}$ electrode needs a cell voltage of just 1.41 V to reach the current density of 10 mA cm$^{-2}$ and exhibited excellent stability during prolonged water electrolysis experiments. After 24 hours of continuous electrolysis trials, NiPd@NF$_{120}$ showed no decrease in OER activity or deterioration of morphological and structural features, exhibiting operating sustainability, durability, and stability. Furthermore, significantly high ECSA after long-term CCE presents boosted electroactive sites on catalysts due to the in-situ generation of more active materials over the catalyst surface. The remarkable catalytic activity of NiPd@NF$_{120}$ was attributed to the synergistic effects of Ni and Pd metals in binary NiPd nano-alloy and the properties of NF substrate. The NiPd catalyst as prepared by the method of the present disclosure demonstrates an efficient strategy to modulate NiPd-based nanostructures for enhanced catalytic performance. Moreover, the rapid and cost-effective catalyst synthesis protocol is an excellent strategy for utilizing a noble metal with a transition metal to fabricate new unique catalyst combinations for competent water electrolysis and energy conversion systems.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A method of making a NiPd nano-alloy electrocatalyst, comprising:
depositing a mixture comprising Pd(II)acetylacetonate Pd($C_5H_7O_2$)$_2$, Ni(II)acetylacetonate Ni($C_5H_7O_2$)$_2$ and a solvent by aerosol-assisted chemical vapor deposition (AACVD) on a surface of a porous metallic substrate, to form the NiPd nano-alloy electrocatalyst,
wherein the depositing is for about 120 minutes,
wherein the depositing forms NiPd nanoparticles on the surface of the porous metallic substrate,
wherein the NiPd nanoparticles have a shape of spherical beads with an average particle size in a longest dimension of from 20 to 50 nm, and
wherein the NiPd nano-alloy electrocatalyst has an overpotential for an oxygen evolution reaction (OER) of about 180 mV for a current density of 10 mA/cm$^2$.

2. The method of claim 1, wherein the porous metallic substrate is a Fe foam, Ni foam, or a Cu foam.

3. The method of claim 1, wherein the NiPd nano-alloy electrocatalyst has:
an onset potential for the OER of at least 1.4 V vs RHE.

4. The method of claim 1, wherein the NiPd nano-alloy electrocatalyst has surface exposed catalytic sites which provide an electrochemical active surface area to measure catalytic activity.

5. The method of claim 4, wherein the NiPd nano-alloy electrocatalyst has a plurality of surface fringes, wherein:
an inter-planar distance between neighboring fringes of the plurality of fringes is at least 0.2 nm.

6. The method of claim 4, wherein the NiPd nano-alloy electrocatalyst has an electrochemically active surface area (ECSA) of about 257.5 cm$^2$.

7. The method of claim 1, wherein the porous metallic substrate has a length of at least 1 cm and a width of at least 2 cm.

8. The method of claim 1, wherein the NiPd nano-alloy electrocatalyst has a Tafel slope of about 58 mV/dec.

9. The method of claim 1, wherein the NiPd nano-alloy electrocatalyst has an exchange current density of about 1.16 mA/cm$^2$.

10. The method of claim 1, wherein the NiPd nano-alloy electrocatalyst has a turnover frequency of from about 4.5 s$^{-1}$.

11. The method of claim 1, wherein the NiPd nano-alloy electrocatalyst has a specific activity of about 3.88 mA/cm$^2$.

12. The method of claim 1, wherein the NiPd nano-alloy electrocatalyst has a small charge transfer resistance of about 7.5.

13. The method of claim 1, wherein the NiPd nano-alloy electrocatalyst has a double layer capacitance of about 10.3 mF.

14. The method of claim 1, wherein the NiPd nano-alloy electrocatalyst has a mass activity, at a roughness factor of at least 350 mV, of about 3571 mA/mg.

15. The method of claim 1, wherein the NiPd nano-alloy electrocatalyst has a 1 to 1 atomic ratio of Ni and Pd.

16. The method of claim 1, wherein the NiPd nano-alloy electrocatalyst maintains the overpotential for the OER of about 180 mV for the current density of 10 mA/cm$^2$ for up to 11 hours.

17. The method of claim 1, wherein the method consists of a single depositing of only the mixture.

18. The method of claim 17, wherein the method does not further include purification, reaction, or activation.

* * * * *